United States Patent [19]
Hirano et al.

[11] Patent Number: 5,448,424
[45] Date of Patent: Sep. 5, 1995

[54] AGC CIRCUIT AND RECORDING AND REPRODUCING APPARATUS USING AGC CIRCUIT

[75] Inventors: Akihiko Hirano; Terumi Takashi, both of Odawara; Kazunori Iwabuchi, Yokohama; Hideyuki Yamakawa, Fujisawa; Yoshiteru Ishida, Chigasaki; Minoru Kosuge, Odawara, all of Japan

[73] Assignee: Hitachi, Ltd., Tokyo, Japan

[21] Appl. No.: 196,478

[22] Filed: Feb. 15, 1994

[30] Foreign Application Priority Data

Feb. 15, 1993 [JP] Japan .................................. 5-025698

[51] Int. Cl.$^6$ .............................................. G11B 5/035
[52] U.S. Cl. ......................................... 360/65; 348/646
[58] Field of Search .................... 360/53, 46, 32, 65, 360/61, 62; 341/139, 142, 132; 348/64 C, 6, 27

[56] References Cited

U.S. PATENT DOCUMENTS

| | | | |
|---|---|---|---|
| 4,398,261 | 8/1983 | Saint-Ajant et al. | 341/139 X |
| 4,447,826 | 5/1984 | Lewis, Jr. et al. | 348/646 |
| 4,466,015 | 8/1984 | Hargo et al. | 348/646 |
| 4,482,916 | 11/1984 | Acampara | 348/646 |
| 4,673,970 | 6/1987 | Matsumato et al. | 348/646 |
| 4,875,045 | 10/1989 | Lynch et al. | 341/139 |
| 5,157,493 | 10/1992 | Hanover et al. | 341/139 X |
| 5,170,166 | 12/1992 | Tanaka et al. | 341/139 |
| 5,187,481 | 2/1993 | Hiller | 341/139 X |

FOREIGN PATENT DOCUMENTS

| | | | |
|---|---|---|---|
| 0053285 | 3/1983 | Japan | 358/27 |
| 0120687 | 6/1985 | Japan | 358/27 |
| 0206796 | 8/1989 | Japan | 358/27 |

Primary Examiner—Donald Hajec
Assistant Examiner—Thien Minh Le
Attorney, Agent, or Firm—Antonelli, Terry, Stout & Kraus

[57] ABSTRACT

An AGC circuit is provided with a variable gain amplifier which changes an amplification gain of an input signal in accordance with an instruction; an extraction unit for extracting a value of an output of the variable gain amplifier at a predetermined interval; and a variable gain control unit for instructing the amplification gain of the variable gain amplifier in a manner such that the amplitude of the input signal is equal to a predetermined amplitude on the basis of the value extracted by the extraction unit. The variable gain control unit is provided with an error signal output device for squaring the value extracted by the extraction unit and for generating an error signal to instruct the amplification gain of the variable gain amplifier in a manner such that the amplitude of the input signal is equal to a predetermined amplitude on the basis of the square value and a square value just before it; and an integrating device for integrating the error signal from the error signal output device and for instructing the amplification gain of the variable gain amplifier.

8 Claims, 18 Drawing Sheets

FREQUENCY CHARACTERISTICS OF (1+D) CIRCUIT

DIFFERENTIAL CHARACTERISTICS IN THE REPRODUCING MODE OF MAGNETIC RECORDING SYSTEM

BAND-WIDTH FILTER CHARACTERISTICS

AGC CIRCUIT AND RECORDING AND REPRODUCING APPARATUS USING AGC CIRCUIT

BACKGROUND OF THE INVENTION

The invention relates to an AGC (Automatic Gain Control) circuit which is used for a magnetic recording and reproducing apparatus or the like and controls an amplitude value in accordance with a set value.

In a magnetic recording/reproducing apparatus to record and reproduce signal information as a magnetic signal onto/from a magnetic recording medium, an amplitude level of the signal which was read out in the data reproducing mode fluctuates due to a difference of the inner and outer rims of the recording medium or the like. An AGC circuit executes a control so as to keep the fluctuation of the signal amplitude to a constant value. FIG. 8 is a constructional diagram of a reading system signal processing circuit of the magnetic recording/reproducing apparatus. FIG. 9 is a block diagram of the AGC circuit. FIG. 10 is a constructional diagram of a VGA controller in the AGC circuit. A conventional technique will now be described with reference to the diagrams.

In FIG. 8, the reading system processing circuit of the magnetic recording/reproducing apparatus comprises: a magnetic recording medium 1 to which a magnetic signal is recorded; a magnetic head 2 to the magnetic signal on the magnetic recording medium to an electric signal 101; an R/W (read/write) amplifier 3 to amplify the electric signal reproduced; an AGC circuit 4 to control an amplitude value of an analog signal 102 amplified; a timing recovery circuit 5 to recover a timing clock signal 104 which is necessary to identify as data from a reproduction signal 103; a decoder 6 to decode the data by the read data and the timing clock; a controller 7 for receiving decoded reproduction data 105 and a timing clock 106 and converting a format of the data and also controlling a data transfer to a host; and a microcomputer 8 to control the whole circuit. In the case where a decoder of Viterbi or the like which inputs a digital value is used as a decoder 6 in FIG. 8, it is desirable that the AGC circuit 4 and the timing recovery circuit 5 are also feedback controlled by using the digital value as an input signal 104 to the decoder when considering the performance. A construction of the AGC circuit of a conventional digital control (analog drive) type is shown in FIG. 9.

As shown in FIG. 9, the conventional AGC circuit 4 comprises: a VGA (Variable Gain Amplifier) 11 to change an amplification gain by a control signal 201; an equalizer 12 to equalize an output 202 of the VGA; an A/D converter 13 to quantize an equalizer output 203; a (1+D) block 14 to execute a band-limiting of a quantization output 204 for a PR4 (Partial-Response Class-IV) process; a VGA controller 15 for detecting an error with the set amplitude from the signal after the (1+D) block and producing an error signal 205; a D/A converter 16 to convert the error signal 205 to the analog value; a multiplier 17 to multiply a D/A converter output 206 by a predetermined coefficient; and an integrator 18 for integrating a multiplier output 207 and producing the control signal 201 of the VGA.

FIG. 10 shows a construction of the VGA controller 15 to form a control signal for driving an analog section such as a VGA or the like on the basis of the amplitude information. In FIG. 10, the VGA controller 15 comprises: a discriminator 21 for judging the level of the input signal 103 and producing a judgment signal 301; a multiplier 22 to multiply the input signal 103 and the judgment signal 301; a multiplexer 23 for selecting one of the set amplitude value A and 0 on the basis of the judgment signal 301 and outputting; a subtracter 24 for subtracting an output 303 of the multiplexer from a multiplier output 302 thereby forming a difference signal 304; a delay 25 to delay the difference signal value 304 by the control clock 104 by one clock; and an adder 26 to add the difference signal 304 and a difference signal 305 as an output of the delay which is preceding by one sample, thereby forming the error signal 205.

The input signal 102 of the AGC circuit will now be described with reference to FIG. 11 and the operation of the conventional AGC circuit will be explained with reference to FIGS. 12 and 13. A sector format of the magnetic recording medium is shown in FIG. 11. Timing charts for the operation of the conventional AGC circuit are shown in FIGS. 12 and 13.

In FIG. 11, a sector which is one group of recording information in a hard disk drive or the like comprises: a GAP 41 which is arranged between sectors and compensates a speed fluctuation amount; an ID 43 in which an address of the sector is written; a sync signal section SYNC 42 to form a timing clock which is necessary to read the ID 43; a GAP 44 which is arranged between the ID and the SYNC and compensates the speed fluctuation amount; an SYNC 45 to form a timing clock which is necessary to read DATA 46 in a manner similar to the SYNC 42; and the DATA 46 to which actual information is stored. Since the address and data are written respectively in the ID 43 and the DATA section 46, the signals which are read out from them have a random pattern. The SYNC 42 has a predetermined regular pattern so that the timing recovery circuit 5 obtains a synchronization on the basis of the pattern. That is, although the DATA 46 can obtain a random value of $\{1, 0, -1\}$ at the sampling point, in the regions of the SYNC 45, for example, in case of executing the PR4 process, a regular bit sequence of $\{1, 0, -1, 0, \ldots\}$ is obtained. After the (1+D) process was executed, the signal is set to a bit sequence of $\{1, 1, -1, 1, \ldots\}$.

The operation of the AGC circuit shown in Fig. 9 will now be explained. First, a case where the random data in the ID 43 and DATA section 46 in the sector is supplied to the AGC circuit will be described.

The VGA output signal 202 which was amplified by gain times through the VGA 11 is equalized by the equalizer 12 and after that it is quantized by the A/D converter 13. After that, in the (1+D) block 14, the value of one sample before is added to the quantized signal to execute a PR process, thereby forming the VGA controller input signal 103. The VGA controller input signal 103 is supplied to the decoder 6 and also to the VGA controller 15. The VGA controller 15 shown in Fig. 10 receives the input signal 103 (V103) and first forms the judgment signal (V301) by the discriminator 21 under the following judging conditions.

$$V103 \geq A/2 \ldots V301 = 1$$
$$-A/2 < V103 < A/2 \ldots V301 = 0$$
$$-A/2 \geq V103 \ldots V301 = -1$$

where, V103: a discriminator input, V301: a discriminator output, and A: an AGC set amplitude value The VGA controller input signal V103 is multiplied by the judgment signal V301 of the discriminator output, thereby setting the signal to the absolute value. The data in which the judgment signal V301 corresponds to "0" is multiplied by "0" and such data is not used as information to set an amplitude. After that, the multiplexer 23 selects 0 when the discriminator output V103 is equal to 0 and selects the set amplitude value A when the discriminator output V103 is equal to 1 or −1. The subtracter 24 forms the difference signal 304 by subtracting the value selected by the multiplexer 23 from the multiplier output signal 302. The difference signal 304 is filtered by the (1+D) operation by the delay 25 and the adder 26, thereby forming the error signal 205. The D/A converter 16 shown in FIG. 9 converts the error signal 205 into the analog value. After that, the analog value is multiplied by a coefficient to determine a loop gain of the AGC loop by the multiplier 17 and the value is subsequently integrated by the integrator 18. The result is used as a control signal 201 of the VGA.

By such a feedback control mentioned above, when the amplitude of the VGA controller input signal is larger than the set amplitude value, the absolute value of the control signal 201 is reduced, thereby decreasing the gain of the VGA. On the other hand, when the amplitude of the VGA controller input signal is smaller than the set amplitude value, the gain is increased. The amplitude of the VGA controller input signal at the sampling point is equalized to the set amplitude value finally. A similar operation is also executed in the case of regular data in the SYNC shown in FIG. 13. In the AGC circuit, the sampling clock recovered by the timing recovery circuit 5 is used as a sampling clock which is used for the A/D converter 13, (1+D) block 14, and VGA controller 15.

There is the technique disclosed in JP-A-61-129913 as a conventional technique.

SUMMARY OF THE INVENTION

It is an object of the invention to provide an AGC circuit which is not influenced by a phase difference and a recording and reproducing apparatus using the AGC circuit.

The problems of the conventional technique will be described by using FIG. 14. As mentioned above, the sampling clock 104 which is used in the AGC circuit is formed by the timing recovery circuit 5. The timing recovery circuit 5 synchronizes with the reference clock just before reading the input data 103 and forms a clock of the same frequency as that of the input data 103. In the reading mode, the timing recovery circuit 5 completes a phase acquisition on the basis of the regular reference pattern of the SYNC 42. In the ID section 43 or the DATA section 46, the timing recovery circuit 5 controls so that the clock 104 of which the synchronization was completed and the data 103 are not out of phase. Therefore, although the data in the ID section 43 or the DATA section 46 is synchronized with the clock, there is a case where the phase of the sampling clock and the phase of the data don't coincide in the beginning of the SYNC. On the other hand, the conventional AGC circuit 4 executes a control of the amplitude on the assumption that the phase of the sampling clock and the phase of the input data coincide as a prerequisite. When there is a phase error between the data and the sampling clock, the output amplitude value of the AGC circuit doesn't coincide with the set amplitude value.

For instance, when there is a phase error $\phi$ as shown in FIG. 14, even if a certain extent of a timing-phase acquisition occurs and the amplitude value of the data at the ideal sampling point (marked with ○ in FIG. 14) coincides with the set amplitude value A, the amplitude value of the data at actual sampling point (marked with Δ in FIG. 14) doesn't coincide with the set amplitude value A. Therefore, the error signal is not equal to zero. There is a problem such that the output of the AGC circuit at the stable point at which the acquisition has been completed is reduced to a value smaller than the set amplitude.

The problem mentioned above will be described further in detail by using an enlarged drawing of the VGA input signal 102 and the VGA controller input signal 103 shown in FIG. 16. The VGA input signal 102 is amplified by gain times by the VGA 11 and is equalized by the equalizer 12. After that, the VGA input signal 102 is quantized by the A/D converter 13. Subsequently, the value of one sample before is added in order to execute the PR process by the (1+D) block 14. The (1+D) block 14 generates at a time t the value obtained by adding an input value at the time t and a past input value which is preceding to the time t by a predetermined time T. In FIG. 16, the value of V103(n) of the VGA controller input signal 103 at a time n is obtained by adding V102(n) of the VGA input signal 102 at the time n and a past value V102(n−1) which is preceding to V102(n) by only the time T. Similarly, the value of V103(m) of the VGA controller input signal 103 at the time m is obtained by adding the value V102(m) of the VGA input signal 102 at the time m and the past value V102(m−1) which is preceding to V102(m) by only the time T. The value of the VGA input signal 102 becomes a regular bit sequence of {1, 0, −1, 0, ...} at ideal sampling points. The VGA controller input signal 103 after the (1+D) process was performed becomes a bit sequence of {1, 1, −1, −1, ...}. As shown in FIG. 16, although the peak of the waveform of the VGA input signal 102 coincides with the ideal sampling point, the peak of the waveform of the VGA controller input signal 103 doesn't coincide with the ideal sampling point. Therefore, with respect to the magnitude relation between the position at the ideal sampling point in the hatched portion and the value sampling point when there is a phase error, those of the VGA input signal 102 and the VGA controller input signal 103 are not always equal. The AGC circuit doesn't set the amplitude of the peak of the VGA controller input signal 103 to the set amplitude A but controls the amplitude at the sampling point to A.

In FIG. 16, for example, it is assumed that the value of the VGA controller input signal 103 at the time n is equal to the set amplitude value A. In this instance, the error signal V205(n) at the time (n) is as shown below and the gain of the VGA is kept as it is.

$$V205(n) = \underset{V103(n)}{(A*1 - A)} + \underset{V103(n-1)}{\{(-A)*(-1) - A\}} = 0$$

When there is a phase error between the input data and the clock as shown at the time (m), however, the error signal V205 (m) is as shown below.

$$V205(m) = (1.3*A*1 - A) + (-0.4*A)*(-1) - 0 = 0.7*A$$
$$\phantom{V205(m) = (}V103(m)\phantom{*1 - A) + }V103(m-1)$$

As mentioned above, although the amplitude value of the VGA controller input signal 103 is equal to the set amplitude value A, the error signal is formed. The error signal is multiplied by (−a) times, thereby reducing the gain of the VGA. Thus, the amplitude value of the VGA controller input signal 103 decreases than the set amplitude value of A.

When the input signal waveform of the VGA controller in the SYNC is regarded as a sine wave, the relation between the phase error and the AGC circuit output amplitude error is as shown in FIG. 15 and the output amplitude fluctuates in a range of a width of 40% for the set amplitude by the phase error.

It is now assumed that, similar to the AGC circuit, the timing recovery circuit which receives the output of the AGC circuit uses a digital signal which is supplied to the decoder as an input signal. As such a timing recovery circuit of the digital input, there is a conventional circuit as shown in, for example, Kurt H. Mueller et al, "Timing Recovery in Digital Synchronous Data Receivers", IEEE Transactions on Communications, Vol. COM-24, May, 1976. The conventional circuit has a phase locked loop (=PLL) including a phase detector of the type in which the phase error is detected by the amplitude value at the sampling point. Even in case of executing a control using such an amplitude value, however, the amplitude fluctuation in the AGC circuit directly results in a gain fluctuation of the phase detector. The gain fluctuation exerts an influence on parameters of a natural frequency $\omega n$ of the phase locked loop and a damping factor $\zeta$ and causes problems such as increase in acquisition time, instability of acquisition characteristics, and the like.

The invention is made in consideration of the problems as mentioned above and provides an AGC circuit which is not influenced by the phase error and a recording and reproducing apparatus using the AGC circuit.

To solve the above problems, according to the invention, there is provided an AGC circuit comprising: a variable gain amplifier to change an amplification gain of an input signal in accordance with an instruction; and a variable gain control unit to instruct the amplification gain of the variable gain amplifier in a manner such that an amplitude of the input signal is set to a predetermined amplitude on the basis of a value extracted at a predetermined interval from an output value of the variable gain amplifier, wherein the variable gain control unit comprises error signal output means for squaring the extracted value and for generating an error signal to instruct the amplification gain of the variable gain amplifier in a manner such that the amplitude of the input signal is equal to the predetermined amplitude on the basis of the square value and a square value just before it and integrating means for integrating the error signal from the error signal output means and for instructing the amplification gain of the variable gain amplifier. The error signal output means can set the result which is obtained by subtracting the value corresponding to the predetermined amplitude from the sum of the square value of the extracted value and the square value just before it into an error signal.

In addition to the error signal output means (hereinafter, referred to as first error signal output means), the variable gain control unit can further comprise: second error signal output means which differs from the first error signal output means and generates an error signal from the extracted value so that the amplitude of the input signal is set to the predetermined amplitude: and switching control means for switching the first and second error signal output means at a predetermined timing. The switching control means controls so that the first error signal output means is used when the data of the input signal is not synchronized with the predetermined extracting interval. The switching control means can also control so as to use the first error signal output means in case of an asynchronized state when a sync signal in the input signal is input and to use the second error signal output means when a signal other than the sync signal in the input signal is input.

There is also provided an AGC circuit comprising: a variable gain amplifier to change an amplification gain of an input signal according to an instruction; and a variable gain control unit to instruct the amplification gain of the variable gain amplifier in a manner such that the amplitude of the input signal is set to a predetermined amplitude on the basis of the value extracted at a predetermined interval from an output value of the variable gain amplifier, wherein the variable gain control unit comprises: error signal output means for squaring the extracted value, for comparing the square value with a predetermined value, for subtracting either one of predetermined first and second values corresponding to the result of the comparison from the square value, for adding the subtracted square value and a square value just before it, and for generating an error signal to instruct the amplification gain of the variable gain amplifier; and integrating means for integrating the error signal from the error signal output means and for instructing the amplification gain of the variable gain amplifier.

Further, the above AGC circuit can be also provided for a recording and reproducing apparatus comprising: a reading circuit to read a signal recorded in recording means; an amplifying circuit to amplify the signal read by the reading circuit; an AGC circuit to control the amplitude of the signal amplified by the amplifying circuit; a timing recovery circuit to recover a timing clock from the signal whose amplitude was controlled by the AGC circuit; a decoder to decode the data by sampling the signal whose amplitude was controlled by the AGC circuit by the timing clock recovered by the timing recovery circuit; a converting circuit to convert the data decoded by the decoder into the analog signal; and an output circuit to generate the analog signal converted by the converting circuit.

The variable gain amplifier amplifies the input signal in accordance with the instructed amplification gain. The A/D converter or the like extracts the value of the input signal from the variable gain amplifier at the predetermined interval (sampling period). The value extracted from the A/D converter locating on the outside of the AGC circuit is supplied to the variable gain control unit. The variable gain control unit squares the extracted value and outputs the result which is obtained by subtracting the value corresponding to the predetermined amplitude (the value which is twice as large as the square value of the predetermined amplitude) from the sum of the square value of the extracted value and a square value just before it as an error signal. Or, it is also possible to respectively subtract the square A 2 (A $2 = A \times A$) of the set amplitude value to the square value of the extracted value and the square value just before it and to obtain the sum of the results of the subtractions. The (1+D) process can be executed by getting the sum of the square value of the extracted value and the square value just before it, so that eliminating the phase error can be eliminated. That is, when it is now assumed that the frequencies of the data of the input signal and the sampling period are equal and the phase difference between them is equal to $\phi$, the input signal to the variable gain control unit is { ..., A'sin ($\pi/4+\phi$), A'sin ($\pi/4+\pi/2+\phi$), A'sin ($\pi/4+\pi+\phi$), A'sin ($\pi/4+3\pi/2+\phi$), ... } at the sampling points { ..., k, k+1, k+2, k+3, ... }. A' denotes an amplitude value of the signal 103 as a sine wave. The above outputs are equal to { ..., A'sin ($\pi/4+\phi$), A'cos ($\pi/4+\phi$), −A'sin ($\pi/4+\phi$), −A'cos ($\pi/4+\phi$), ... }. The values obtained by squaring those values, namely, {(A'sin ($\pi/4+\phi$)) 2, (A'cos 2($\pi/4+\phi$)) 2, (A'sin ($\pi/4+\phi$)) 2, A'cos ($\pi/4+\phi$)) 2, ... } have a format such that (A'sin ($\pi/4+\phi$)) 2 and A'cos ($\pi/4+\phi$)) 2 are alternately output. Therefore, the error signal obtained by subtracting the square A 2 of the set amplitude value and getting the sum of the two successive values by (1+D) is equal to ((A'sin ($\pi/4+\phi$)) 2+(A'cos ($\pi/4+\phi$)) 2−2A 2)=A' 2−2A 2 and the term of the phase difference $\phi$ is erased.

When the second error signal output means for generating the error signal so that the amplitude of the input signal is equal to the predetermined amplitude from the extracted value is provided, the switching control means switches to the first error signal output means in the case where the data of the input signal is not synchronized with the predetermined interval in the regular data sequence in the SYNC region, thereby controlling the amplitude by the error signal from the first error signal output means. In the data region which takes three random values, the switching control means switches to the second error signal output means, thereby controlling the amplitude by the error signal from the second error signal output means. The error signal is multiplied with a coefficient to set a loop gain and is added to the preceding value by the integrating means and a resultant signal is set to a control signal of the variable gain amplifier, thereby performing a negative feedback.

According to the invention, the reading operation of the data magnetic recording and reproducing apparatus can be stabilized.

DESCRIPTION OF THE PREFERRED EMBODIMENTS

Figure 1:
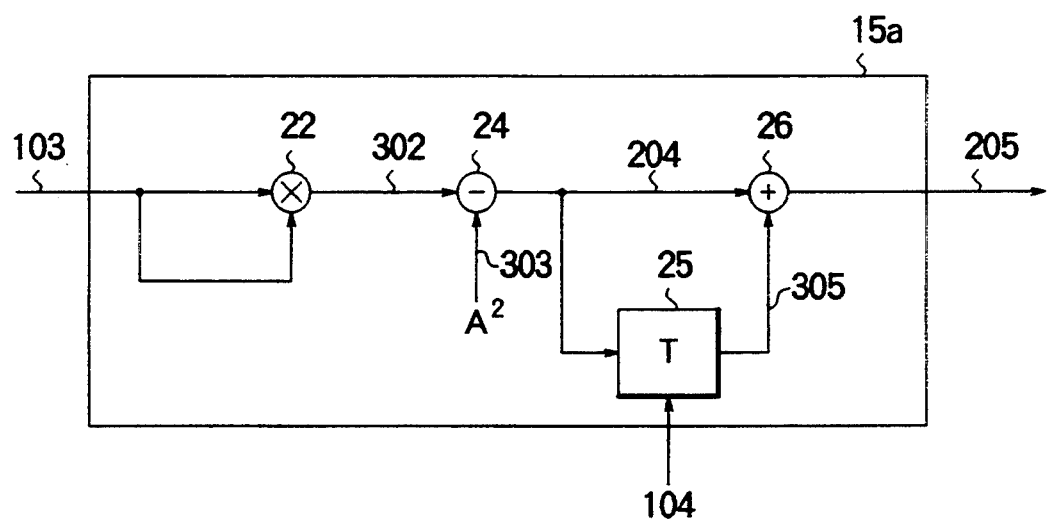
FIG. 1 is a constructional diagram of a VGA controller of the invention.
Figure 2:
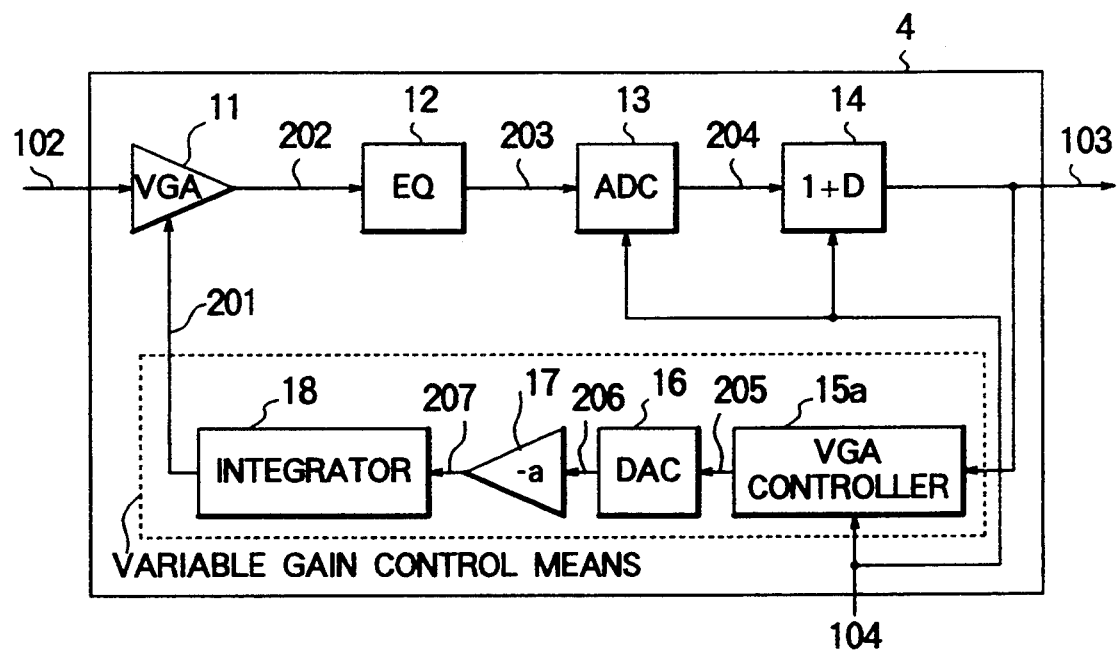
FIG. 2 is block diagram of an AGC circuit of the invention.
Figure 3:
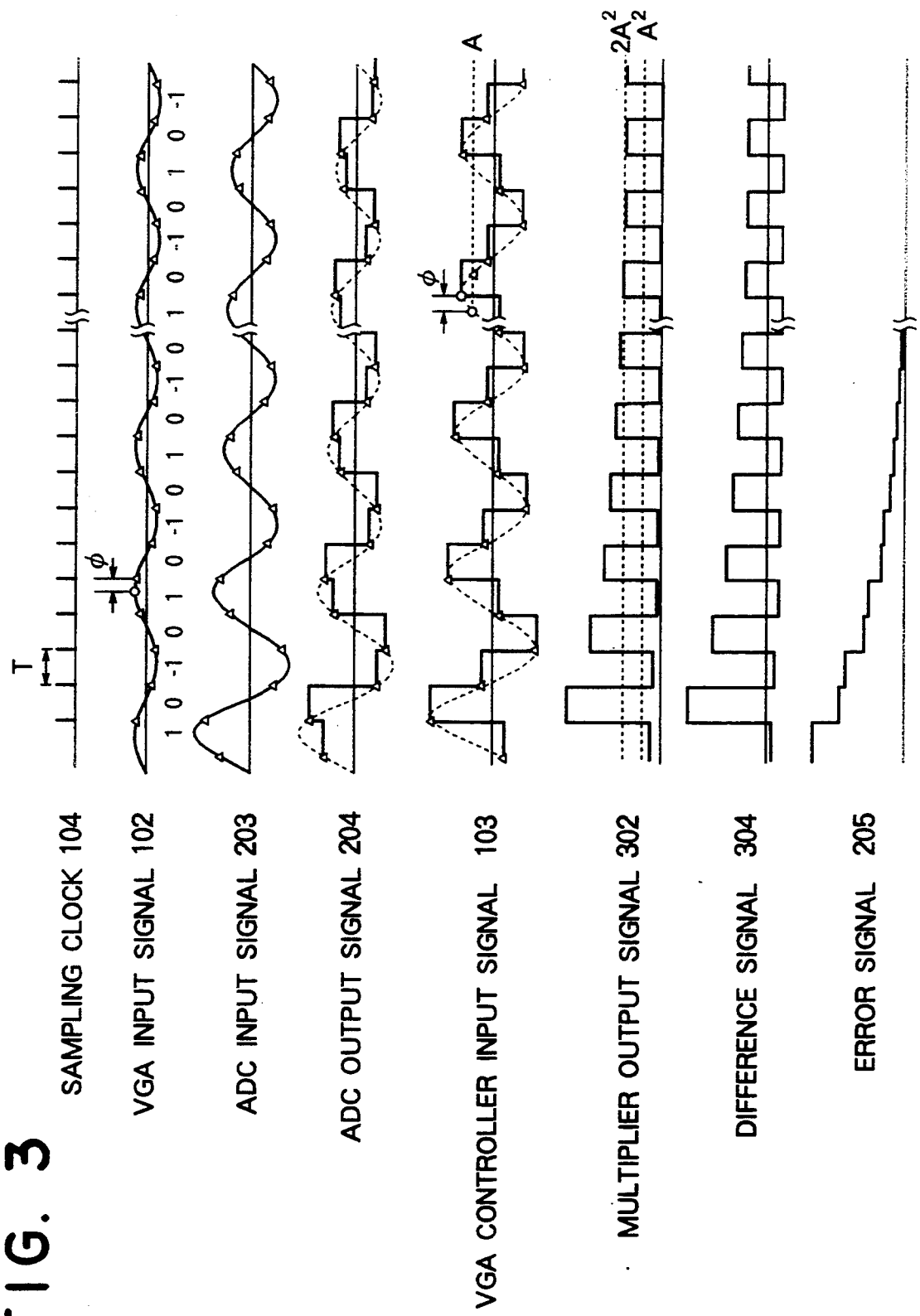
FIG. 3 is an explanatory diagram of the operation of the AGC circuit of the invention.

An embodiment of the invention will now be described with reference to the drawings. FIG. 1 is a block constructional diagram of a VGA controller showing a feature of the embodiment. FIG. 2 is an AGC circuit having the VGA controller of the embodiment. FIG. 3 is a diagram to explain the operation of the AGC circuit having the VGA controller of the embodiment. A whole construction of a reading system signal processing circuit of a magnetic recording and reproducing apparatus using the AGC circuit is substantially the same as that shown in FIG. 8.

Figure 8:
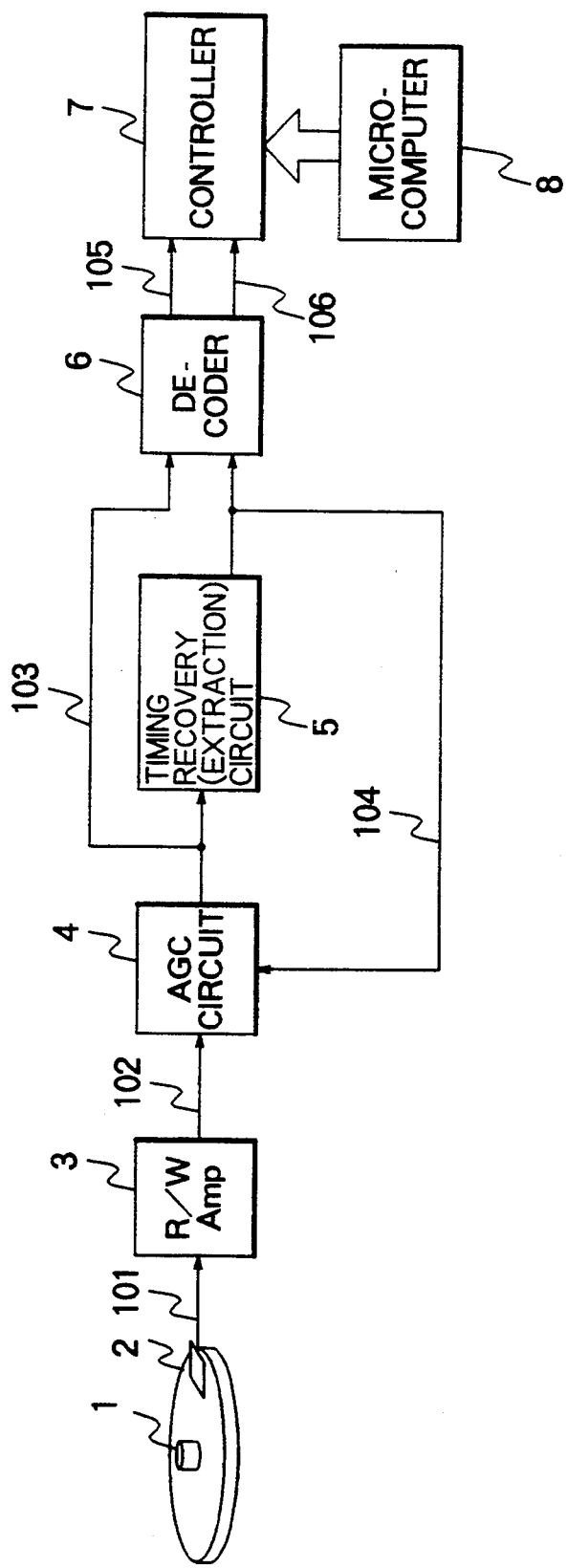
FIG. 8 is a block diagram of a reading system signal processing circuit of a data magnetic recording and reproducing apparatus.
Figure 9:
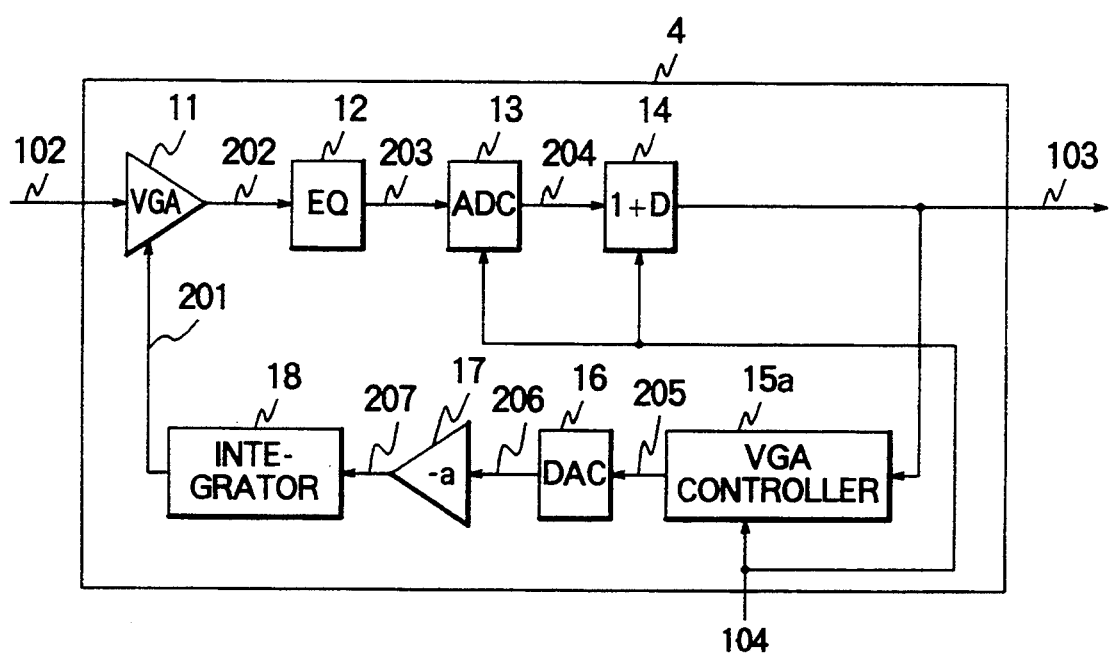
FIG. 9 is a block diagram of a conventional AGC circuit.

In FIG. 8, the reading system signal processing circuit of the magnetic recording and reproducing apparatus comprises: the magnetic recording medium 1 as memory means to which a magnetic signal is recorded; the magnetic head 2 to convert the magnetic signal on the magnetic recording medium to the electric signal 101; the R/W (read/write) amplifier 3 to amplify the electric signal reproduced; the AGC circuit 4 to control the amplitude value of the analog signal 102 amplified; the timing recovery circuit 5 to recover the timing clock signal 104 which is necessary to identify as data from the reproduction signal 103; the decoder 6 to decode the data by the read data and the timing clock; the controller 7 for receiving the decoded reproduction data 105 and the timing clock 106 and converting a format of the data and also controlling a data transfer to the host; and the microcomputer 8 to control the whole circuit. The AGC circuit can be provided not only in the magnetic recording and reproducing apparatus but also in the data recording and reproducing apparatus which executes the reproduction of the memory means.

In this case, in addition to the above construction, the apparatus can also have a converting circuit to convert the data decoded by the decoder into the analog signal and an output circuit to output the analog signal converted by the converting circuit.

The construction of the VGA controller in Fig. 1 will now be described. The VGA controller in the embodiment comprises: the multiplier 22 to multiply the input signal 103; the subtracter 24 for subtracting the square value of the set amplitude value A from the multiplier output 302; the delay 25 to execute the operation of (1+D); and the adder 26. The delay is controlled by the clock 104 from the timing recovery circuit.

In FIG. 2, the AGC circuit 4 comprises: the VGA (Variable Gain Amplifier) 11 of a variable gain section whose gain is changed by the control signal 201; the equalizer (EQ) 12 to equalize the output 202; the A/D converter 13 of the extracting section to quantize the equalizer output 203; the (1+D) block 14 to execute a band-limiting of the quantization output 204 for a PR4 (Partial-Response Class-IV) process; the VGA controller 15 for detecting an error with the set amplitude from the signal after the (1+D) block and producing the error signal 205; the D/A converter 16 to convert the error signal 205 to the analog value; the multiplier 17 to multiply the D/A converter output 206 by a predetermined coefficient; and the integrator 18 for integrating the multiplier output 207 and producing the control signal 201 of the VGA. The VGA controller 15 is error signal output means. The controller 15 squares the value extracted by the A/D converter 13 of the extracting section (or the output value of the (1+D) block 14), compares the square value with a predetermined value, subtracts either one of the predetermined first and second values corresponding to the comparison result from the square value, adds the subtracted square value and the subtracted square value just before it, thereby generating an error signal to instruct the amplification gain of the variable gain amplifier. As a variable gain control unit, it is also possible to have integrating means for integrating the error signal from the VGA controller 15 of the error signal output means and for instructing the amplification gain of the variable gain amplifier. Further, the D/A converter 16 and the multiplier 17 can be also provided in the variable gain control unit.

The operation of the VGA controller shown in FIG. 1 and the operation of the AGC circuit shown in FIG. 2 will now be described.

The VGA output signal 202 which was amplified by gain times through the VGA 11 is equalized by the equalizer 12 and quantized by the A/D converter 13. After that, the value which is preceding by one sample is added to execute the PR process, thereby forming the VGA controller input signal 103. The VGA controller input signal 103 is supplied to the decoder 6 and also to a VGA controller 15a. The VGA controller 15a shown in FIG. 1 receives the input signal 103 (V103) and calculates the square of the input signal 103 by the multiplier 22. The subtracter 24 forms the difference signal 204 by subtracting the square value of A from the multiplier output signal 302. The difference signal 204 is filtered by the operation of (1+D) by the delay 25 and adder 26, thereby forming the error signal 205. After the signal was converted to the analog value by the D/A converter 16 shown in FIG. 2, the signal is multiplied by a coefficient to determine a loop gain of the AGC loop by the multiplier 17 and the resultant value is subsequently integrated by the integrator 18, thereby forming the control signal 201 of the VGA.

The principle of the VGA controller as shown in FIG. 1 will now be explained with reference to FIG. 3. The VGA controller in the embodiment is used in the case where the information of the SYNC 42, that is, a regular bit sequence such that the input to the VGA controller is {1, 1, −1, −1, ...} is supplied to the AGC circuit.

As shown in FIG. 3, the value at each sampling point of the VGA controller input signal 103 in the regular bit sequence is regarded as a sine function of the period 4T when the period of the data bit sequence is set to T. That is, when it is assumed that the frequencies of the data and the sampling clock are equal and the phase difference between them is equal to $\phi$, the VGA controller input signal is { ..., $A'\sin(\pi/4+\phi)$, $A'\sin(\pi/4+\pi/2+\phi)$, $A'\sin(\pi4+\pi+\phi)$, $A'\sin(\pi4+3\pi/2+\phi)$, ... } at the sampling points of { ..., k, k+1, k+2, k+3, ... }. $A'$ denotes the amplitude value of the signal 103 as a sine wave. The above outputs are equal to { ..., $A'\sin(\pi/4+\phi)$, $A'\cos(\pi4+\phi)$, $-A'\sin(\pi4+\phi)$, $-A'\cos(\pi4+\phi)$, ... }. The values {$(A'\sin(\pi/4+\phi))$ 2, $A'\cos(\pi4+\phi))$ 2, $(A'\sin(\pi/4+\phi))$ 2, $(A'\cos(\pi/4+\phi))$ 2, ... } obtained by squaring those values by the multiplier 22 have a format such that $(A'\sin(\pi4+\phi))$ 2 and $(A'\cos(\pi/4+\phi))$ 2 are alternately output. Therefore, the error signal 205 as a VGA controller output obtained by subtracting the square A 2 of the set amplitude value and getting the sum of the two successive values by the (1+D) block is equal to $(A'\sin(\pi/4+\phi))$ 2+$(A'\cos(\pi/4+\phi))$ 2−2A 2)=A 2−2A 2 and the term of the phase difference $\phi$ is erased. The AGC circuit controls the feedback loop so that the output value (A' 2−2A 2) is equal to 0 by setting properly the coefficient to multiply by the multiplier and executing a negative feedback. Therefore, $A'=2\ 0.5\times A$ at a converging point is obtained and there is a relation of 2 0.5:1 between the amplitude value A' of the input sine wave and the amplitude value A at the sampling point. Thus, the amplitude value at the sampling point can be set to A by the above control.

Figure 4:
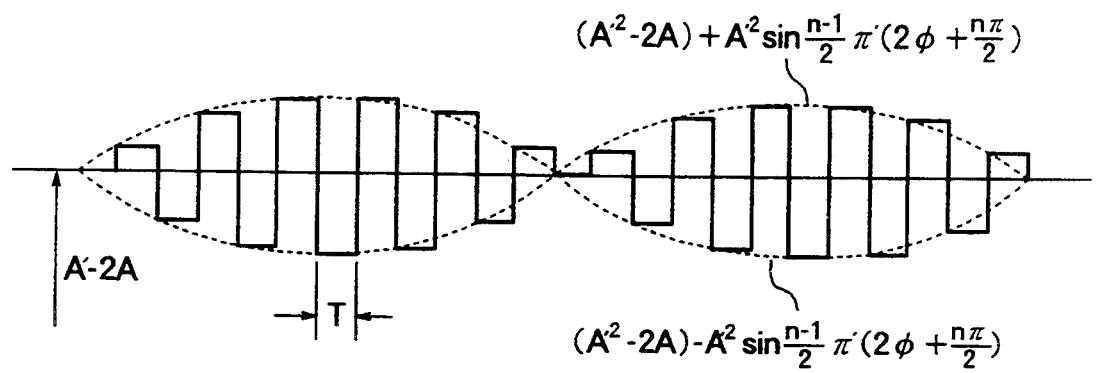
FIG. 4 is an explanatory diagram of a fluctuation of an AGC output amplitude when at the time of asynchronization.

In the region of the SYNC 42 where the VGA controller of the embodiment is used, the timing recovery circuit is synchronized with the reference clock as mentioned above. Although the frequency of the reference clock and the frequency of the data which is actually read after that ought to be ideally equal, there is a case where they are slightly deviated by a fluctuation of the disk rotation or the like. In this case, the amplitude of the AGC output doesn't have a predetermined value but fluctuates. FIG. 4 shows the VGA controller output when the frequency of the sampling clock is (n) times as high as the frequency of the data. The VGA controller output shown by the solid line fluctuates at every sampling period T while setting a function of the frequency error (n) as an envelope shown by a broken line in FIG. 4. A DC component of the fluctuation of the VGA controller output is equal to the ideal set amplitude (A' 2−2A 2). Since the value is alternately inverted to the positive and negative values and is integrated by the integrator 18 shown in FIG. 2, the fluctuation amount of the control signal as an integration value can be reduced. Therefore, even if there is an error in the frequency, the invention can cope with such an error.

Figure 18:
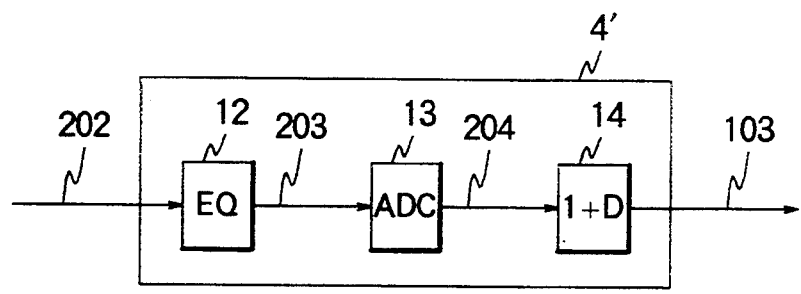
FIG. 18 is a block diagram of a filter circuit.
Figure 19:
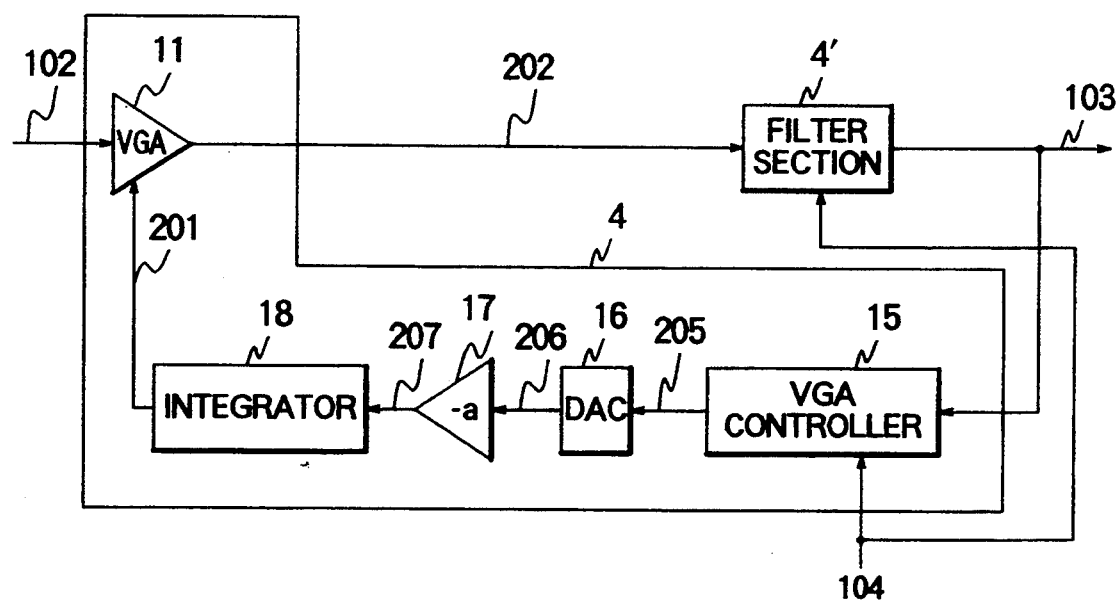
FIG. 19 is a block diagram of the AGC circuit in the invention.
Figure 20:
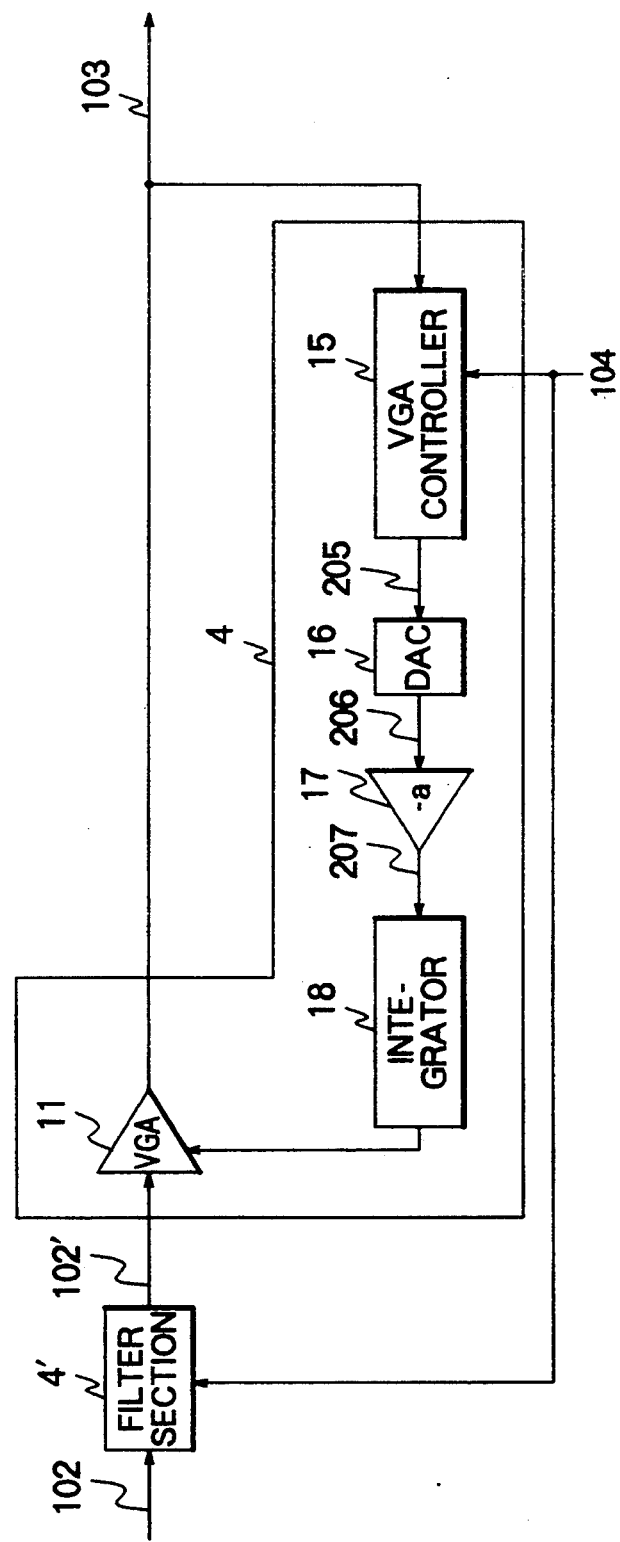
FIG. 20 is a block diagram of the AGC circuit in the invention.

Other constructions of the AGC circuit in the embodiment are shown in FIGS. 19 and 20. Further, a block diagram of a filter section 4' in FIGS. 19 and 20 is shown in FIG. 18.

FIGS. 19 and 20 show constructions in the case where the equalizer 12 shown in FIG. 2, the A/D converter 13 and the (1+D) block 14 are set to a filter section 4' and the filter section 4' is not included in the AGC circuit. The construction of the equalizer 12, A/D converter 13, and (1+D) block 14 can be arbitrarily selected. For example, as shown in FIG. 18, it is also possible to arrange them in accordance with the order of the equalizer 12, A/D converter 13, and (1+D) block 14 or the order of the A/D converter 13, (1+D) block 14, and equalizer 12. Since the signals which are handled before and after the A/D converter 13 are different because they have the analog and digital values, the circuit constructions of the (1+D) block 14 and the equalizer 12 differ in corresponding to them. Further, the filter section 4' can be also arranged at either one of the front and post stages of the VGA as shown in FIGS. 19 and 20. A low pass filter to eliminate the harmonic component can be also provided at the post stage of the VGA.

Figure 21A:
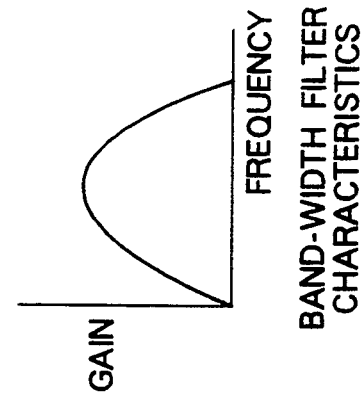
FIGS. 21A to 21C are frequency characteristics diagrams.
Figure 21B:
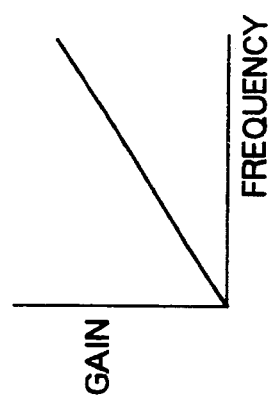
Figure 21C:
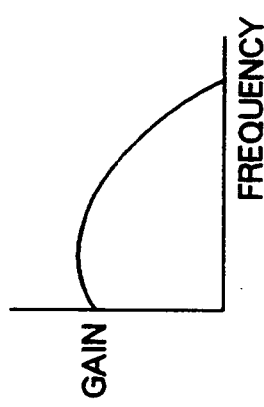

The (1+D) block 14 which handles the digital value will now be described. In a signal processing circuit for a recording apparatus, there is a PRML (Partial Response Maximum Likelihood) as means for realizing a high density recording (that is, high performance). The PR is means for converting into a code format having an electric power spectrum which is matched to the transfer characteristics of the apparatus and is mainly classified into 5 kinds of classes according to the power spectrum format. Among them a PR 4 (class IV) can be mentioned as means which is adapted to the magnetic recording apparatus in the embodiment. The PR4 can be realized by inserting the (1+D) block into the signal processing circuit and providing the differential characteristics and band-width filtering characteristics in the reproducing mode which the magnetic recording system have. FIGS. 21A to 21C show frequency characteristics. FIG. 21A shows the frequency characteristics of the (1+D) block. FIG. 21B shows the differential characteristics which the magnetic recording system has. FIG. 21C shows the band-width filtering characteristics. ML is generally called a maximum likelihood decoding (there is a Viterbi decoding as means for realizing it). The maximum likelihood decoding is a method of time-sequentially discriminating the signal. By using a combination of PR and ML, the S/N ratio of the reproduction signal can be efficiently improved and a high density recording can be realized. The (1+D) block 14 in the embodiment is used to execute the process of the PR4. Therefore, there is no need to include the (1+D) block 14 into the AGC circuit. The equalizer 12 is also used to equalize the signal which is handled and to guarantee the performance of the decoder. Since the A/D converter 13 converts the analog signal into the digital value in order to execute the ML, there is no need to include the A/D converter 13 into the AGC circuit.

Figure 17:
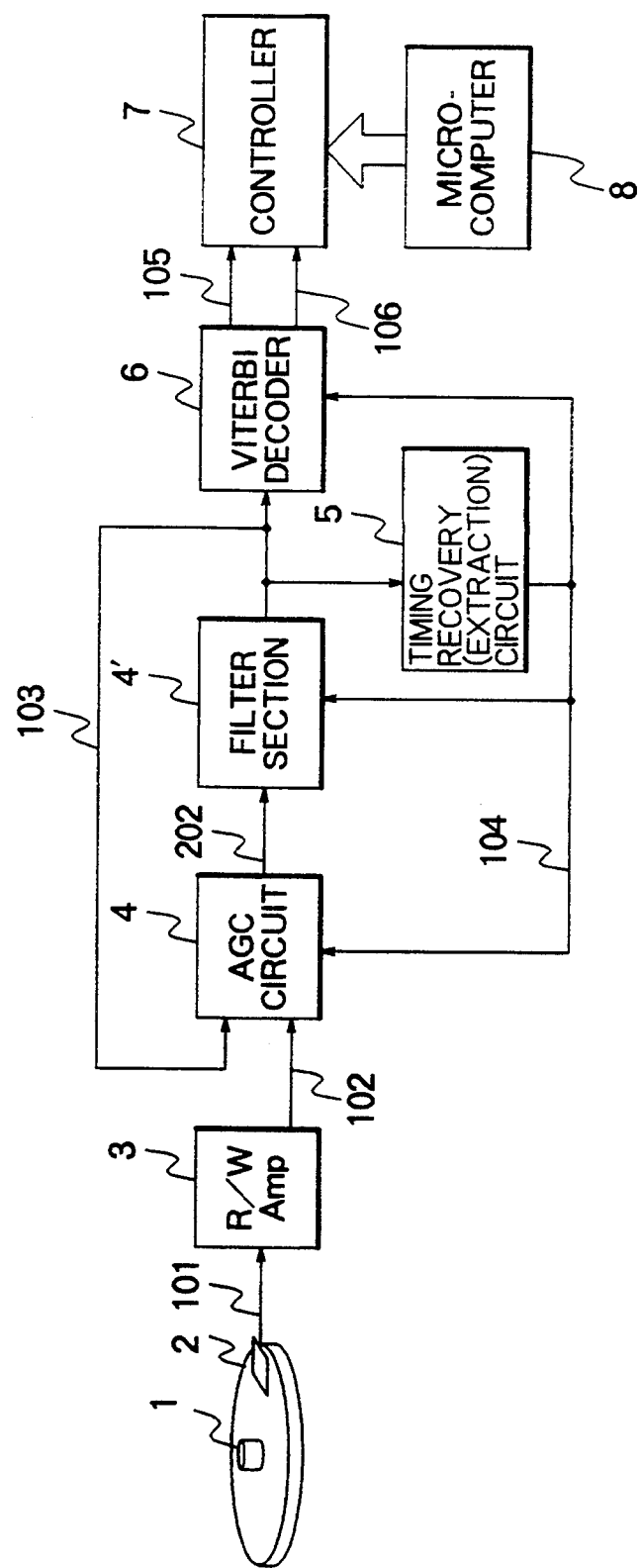
FIG. 17 is a block diagram of a reading system signal processing circuit of a data magnetic recording and reproducing apparatus.

In the construction as shown in FIG. 19, a whole construction of the reading system signal processing circuit of the magnetic recording and reproducing apparatus having the AGC circuit is as shown in FIG. 17.

Figure 5:
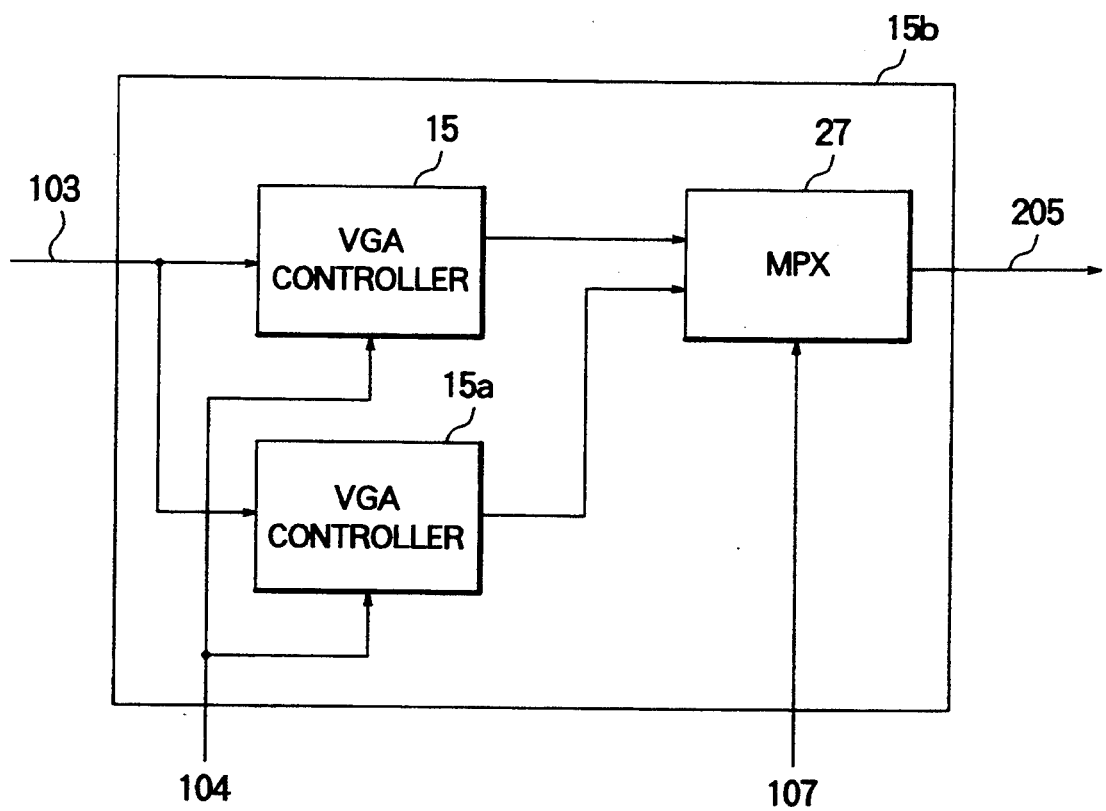
FIG. 5 is a block diagram of a VGA controller of the invention.
Figure 10:
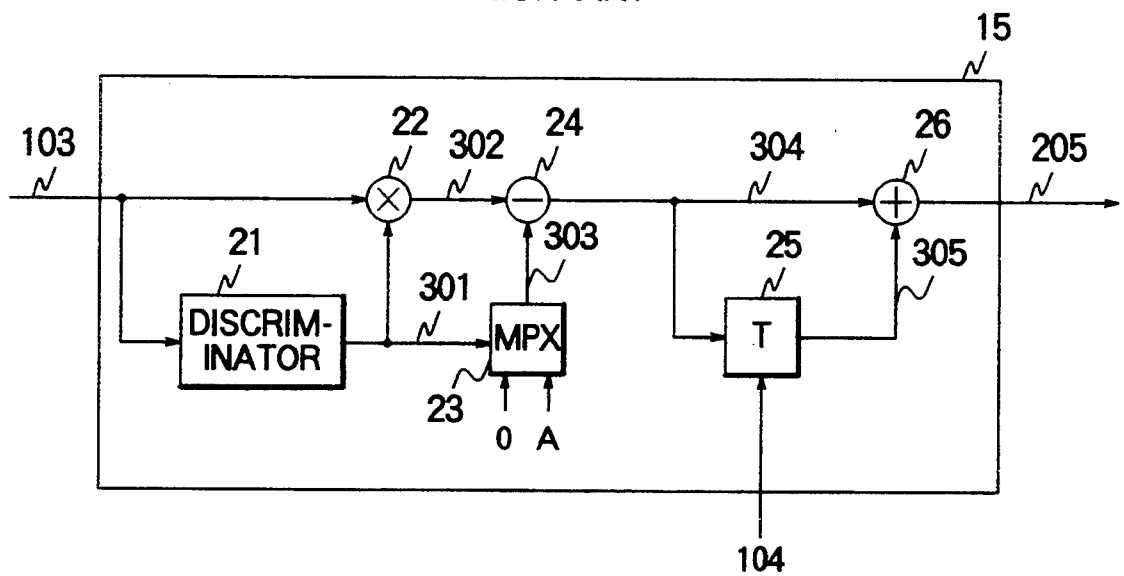
FIG. 10 is a constructional diagram of a conventional VGA controller.
Figure 11:
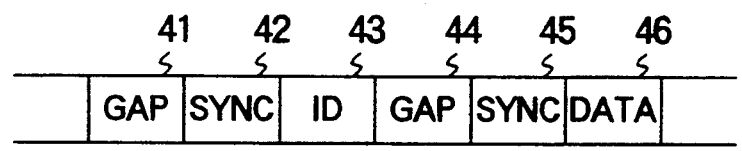
FIG. 11 is an explanatory diagram of a sector format of a magnetic recording medium.
Figure 12:
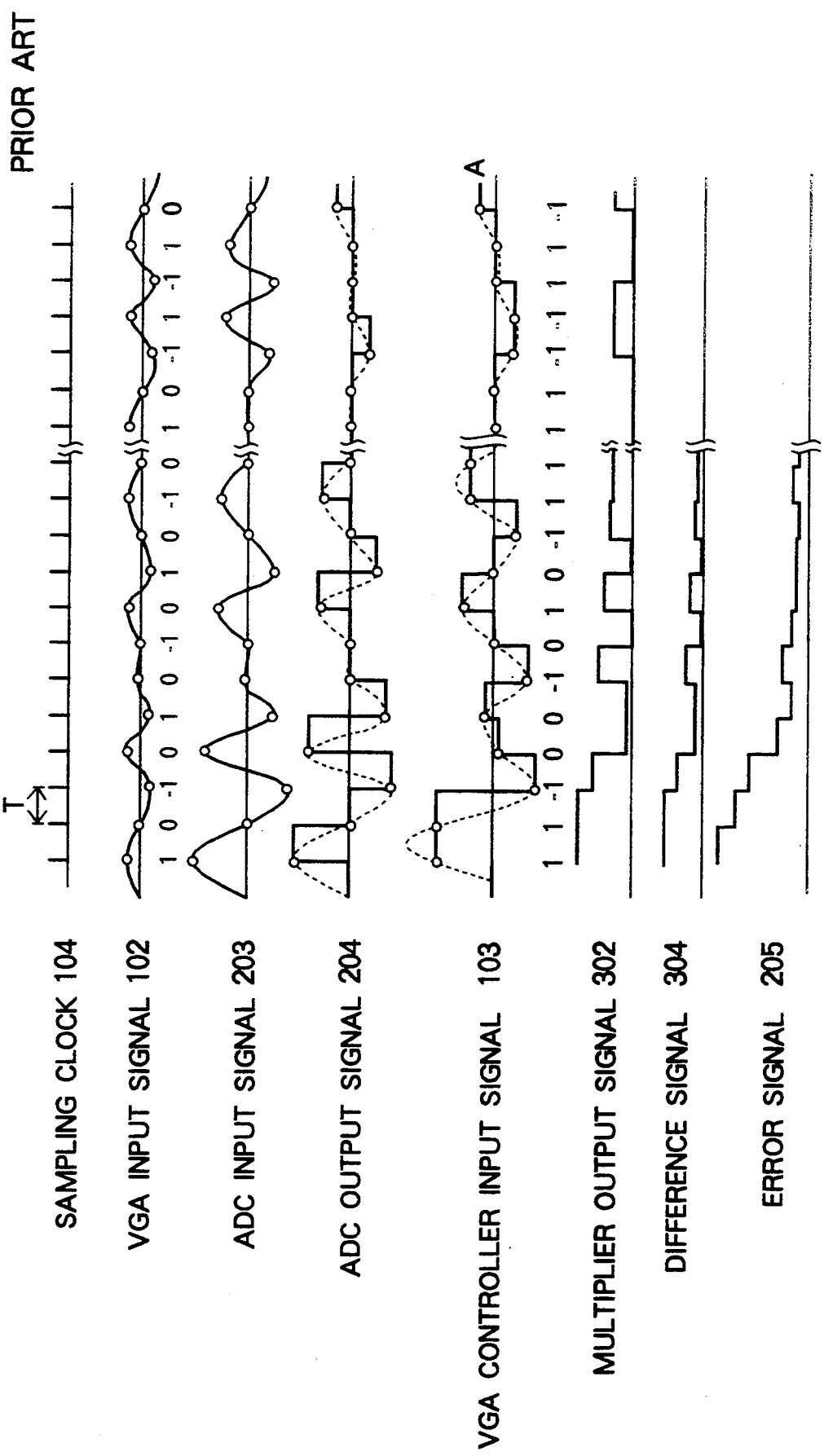
FIG. 12 is an explanatory diagram of the operation of the conventional AGC circuit.
Figure 13:
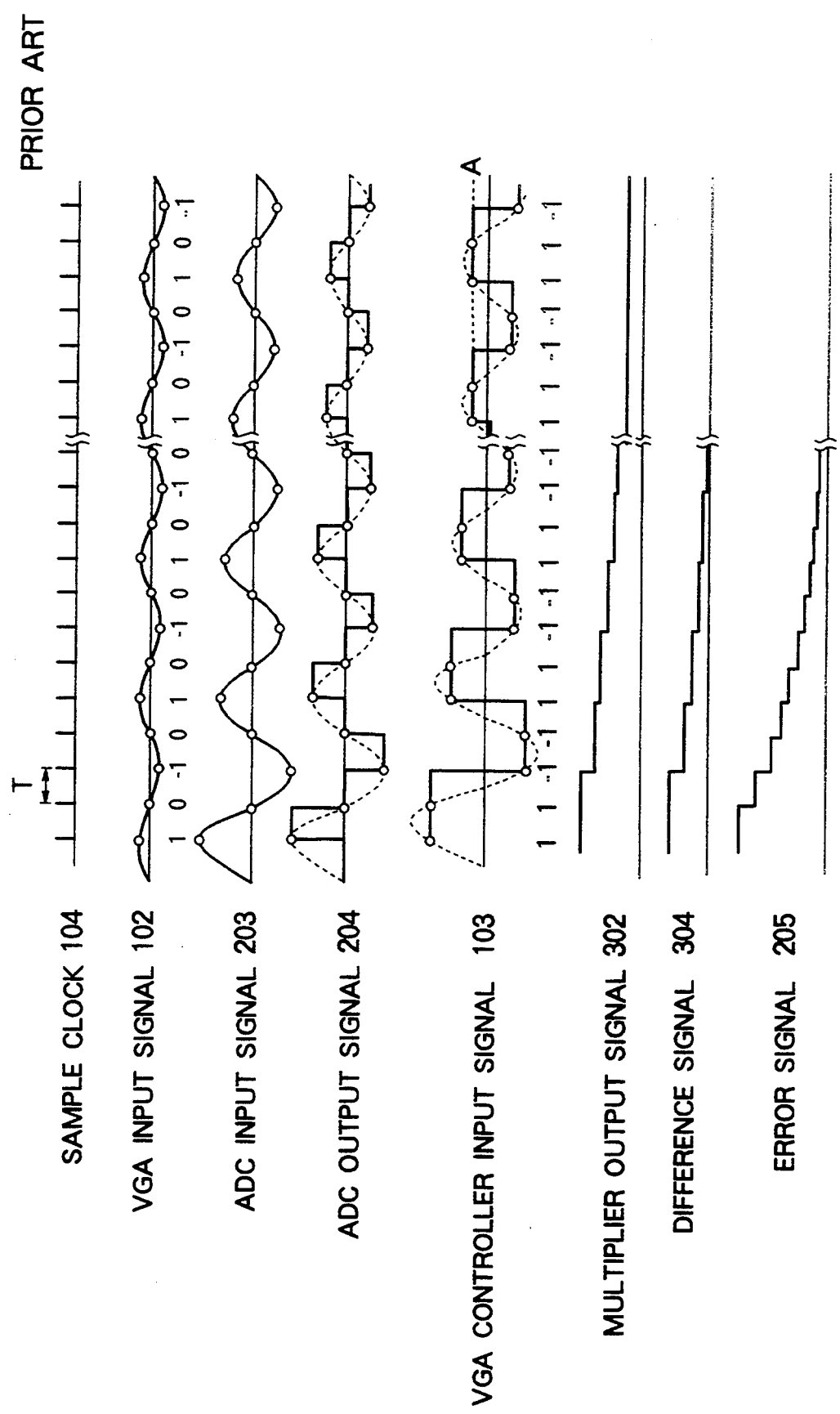
FIG. 13 is an explanatory diagram of the operation of the conventional AGC circuit.
Figure 14:
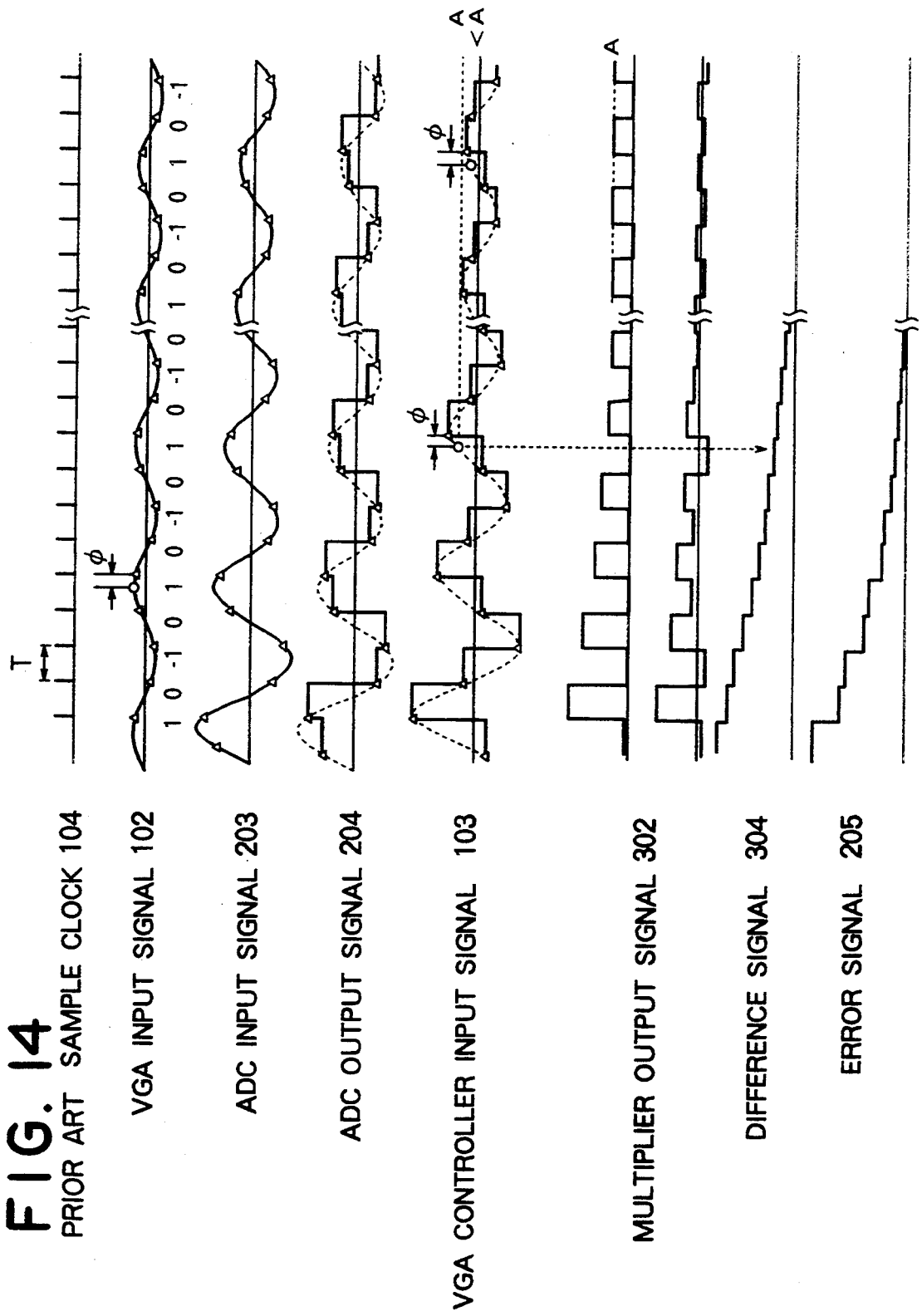
FIG. 14 is a diagram to explain the problems of the conventional AGC operation.
Figure 15:
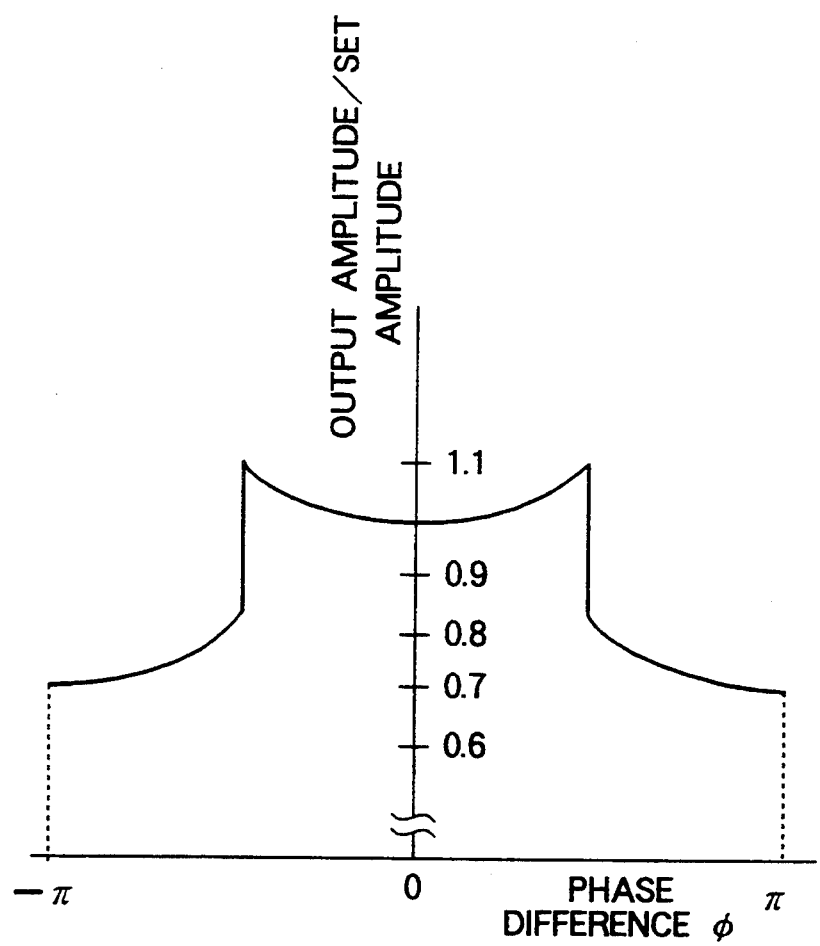
FIG. 15 is an explanatory diagram of the relation between a phase error and an output amplitude.
Figure 16:
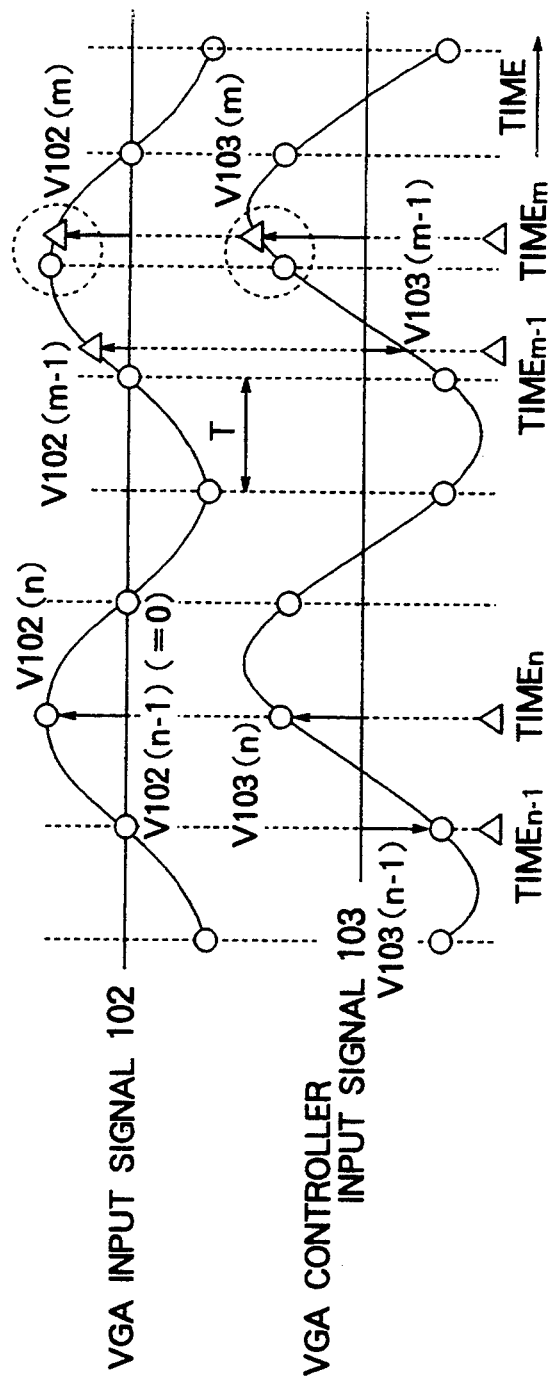
FIG. 16 is a diagram to explain the problems of the conventional AGC operation.

Since the VGA controller shown in FIG. 1 mentioned above inputs the regular sine waveform as a prerequisite, the conventional VGA controller 15 can be also used in the data region having three random values. FIG. 5 shows a VGA controller 15b which can operate in the whole region which needs the AGC control. In FIG. 5, the VGA controller 15b is used in place of the VGA controller 15a in the AGC circuit shown in FIG. 2. The (1+D) block output 103 is supplied to the conventional VGA controller 15 shown in FIG. 10 and to the VGA controller 15a shown in FIG. 1. Either one of the outputs of the VGA controllers 15 and 15a is selected by a control signal 107 by using a multiplexer 27 and supplied to the D/A converter 16. That is, the variable gain control unit can be constructed by: error signal output means for squaring the signal extracted by the extracting unit and outputting a first error signal to instruct the amplification gain of the variable gain amplifier from the amplitude of the input signal based on the square value and the square value just before it in a manner such that the amplitude of the input signal is equal to a predetermined amplitude; second error signal output means which is different from the first error signal output means and generates an error signal from the value extracted by the extracting unit in a manner such that the amplitude of the input signal is equal to a predetermined amplitude; switching control means for switching the first and second error signal output means at a predetermined timing; and integrating means for integrating the error signal and instructing the amplification gain of the variable gain amplifier. The control signal 107 can be generated from the controller 7 shown in FIG. 8. The controller 7 controls in a manner such that in the region of the SYNC 42, the output from the VGA controller 15a shown in FIG. 1 is selected and, in the region of the ID section 43 or DATA section 46, the output from the conventional VGA controller 15 shown in FIG. 10 is selected. The switching timing will be further described later.

In place of using the multiplexer 27, it is also possible to arrange switching circuits at the front stages of the VGA controllers 15a and 15 and to control by the control signal 107. In this case as well, a selection control is performed in a manner such that in the region of the SYNC 42, the (1+D) block output 103 is supplied to the VGA controller 15a shown in FIG. 1 and, in the region of the ID section 43 or DATA section 46, the (1+D) block output 103 is supplied to the conventional VGA controller 15 shown in FIG. 10.

Figure 22:
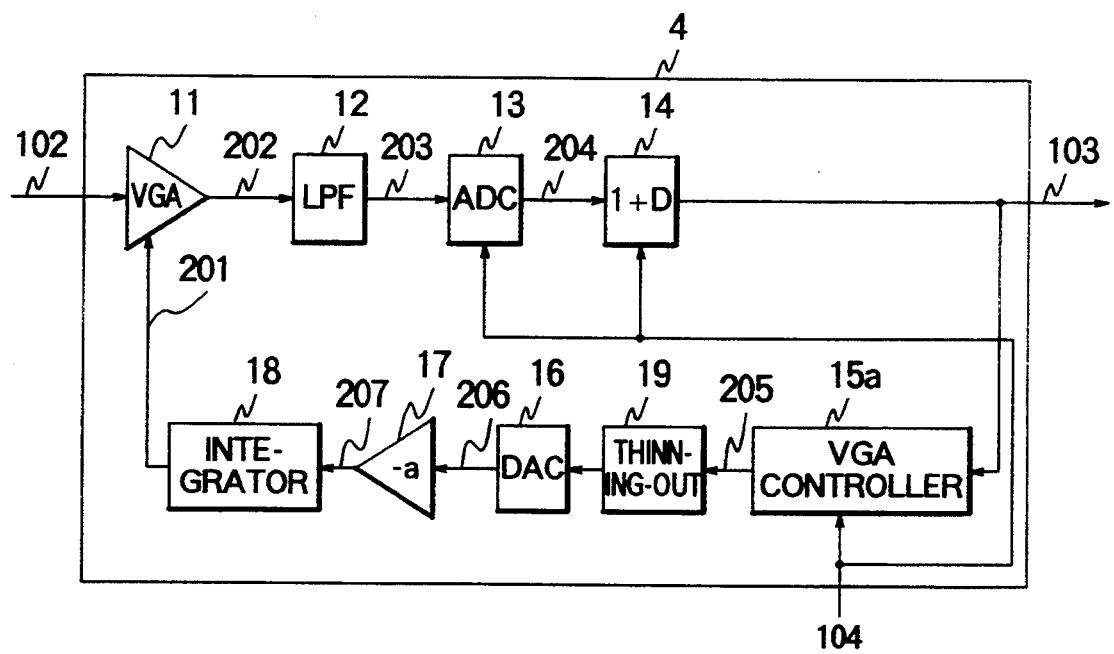
FIG. 22 is a block diagram of the AGC circuit of the invention.
Figure 23:
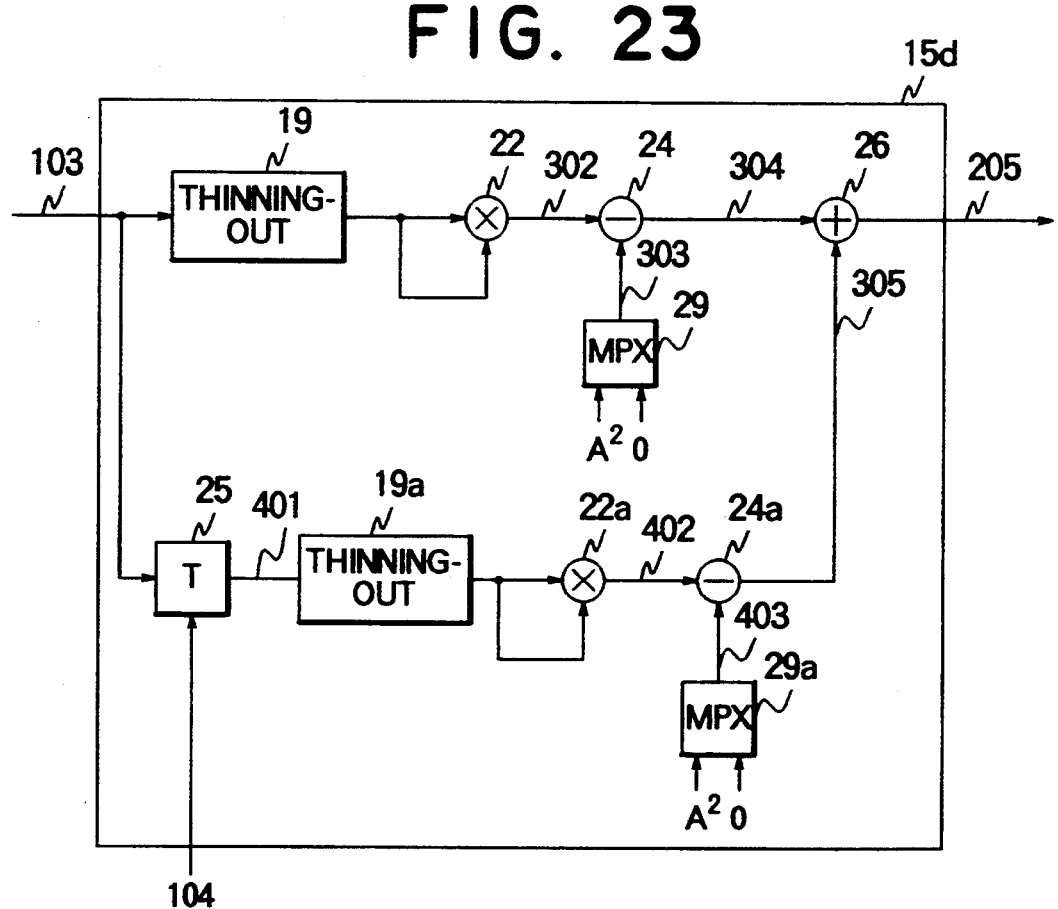
FIG. 23 is a block diagram of the VGA controller of the invention.

It is unnecessary that the VGA controller mentioned above continuously supplies the produced error signal 205 to the D/A converter 16 every clock. Thinning-out means 19 for inputting the error signal 205 and for outputting the error signal only once for (n) clocks and for outputting a "0" signal in the other cases can be also provided in the AGC loop as shown in FIG. 22. By providing the thinning-out means 19 into the loop, a loop gain can be reduced into (1/n) of that in the case where it is not provided in the loop, so that loop gain adjusting means similar to the multiplier 17 can be realized. On the other hand, a similar effect can be also obtained by an AGC block using a VGA controller 15d in which the thinning-out means 19 is arranged at the input stage of the multiplier for executing the square arithmetic operation as shown in FIG. 23. In FIG. 23, the thinning-out means 19 receives the input signal 103 and the thinning-out means 19a receives a signal 401 which is obtained by delaying the input signal 103 by one clock by the delay 25. An output of the thinning-out means 19 is squared by the multiplier 22. An output of the thinning-out means 19a is squared by a multiplier 22a. Either one of the square of the set amplitude value A and "0" which was selected by each multiplexer is subtracted from the square results 302 and 402 by subtracters 24 and 24a, respectively, so that differential signals 304 and 305 are derived from the subtracters 24 and 24a. Those differential signals are added by the adder 26, so that the error signal 205 is produced. In the case where the outputs of the thinning-out means 19 and 19a are equal to "0" irrespective of the inputs, each multiplexer selects "0" as a subtracter input, thereby allowing the square output (=0) to be output from the subtracter. In the case where the input signals to the thinning-out means 19 and 19a are directly output through the thinning-out means, each multiplexer selects the square of the set amplitude value A and subtracts from the square output. According to the construction shown in FIG. 23, in the case where the outputs of the thinning-out means 19 and 19a which occupy (n−1) times among (n) times are equal to 0 irrespective of the input signals, since both of the input and output of each of the multiplier, subtracter, and adder are equal to 0, an electric power consumption in association with the switching operation is suppressed.

Figure 6:
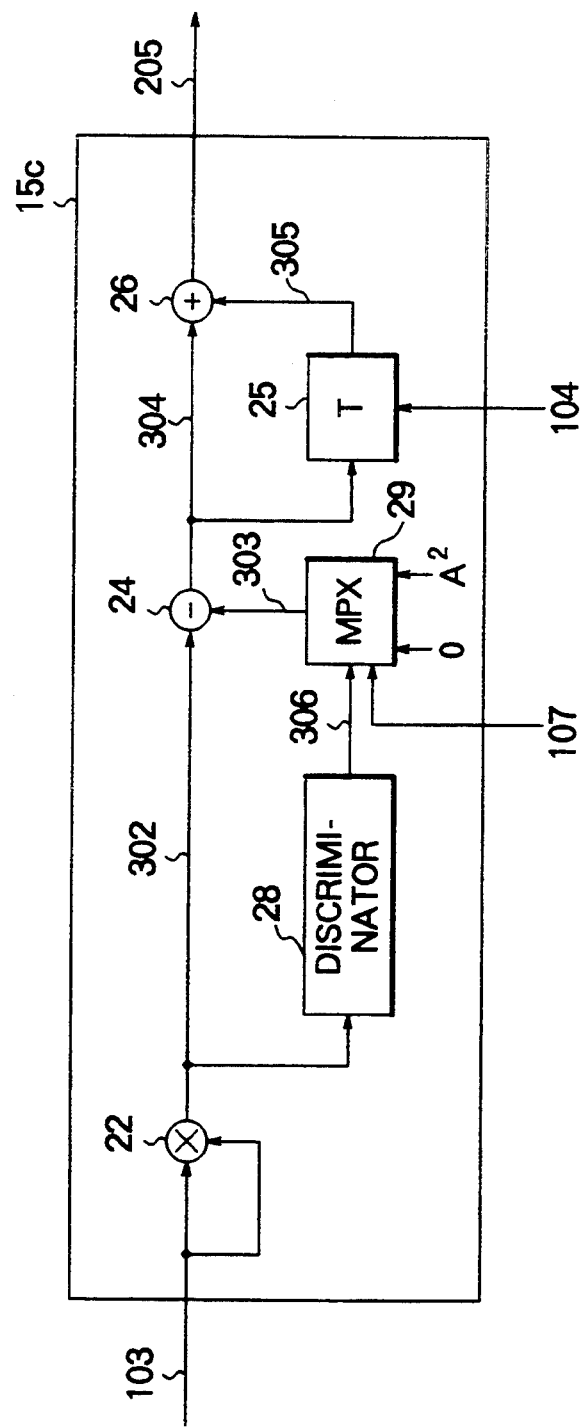
FIG. 6 is a constructional diagram of the VGA controller of the invention.

When considering the internal constructions of the VGA controllers 15 and 15a, there are many portions which can be commonly used like a (1+D) section constructed by the delay 25 and adder 26 and the like. Therefore, both of the VGA controllers don't need to be perfectly independent as shown in FIG. 5. For example, a construction as shown in FIG. 6 is also considered. A VGA controller 15c shown in FIG. 6 comprises: the multiplexer 22 for calculating the square of the VGA controller input signal 103; a discriminator 28 for judging the multiplier output level and outputting a judgment signal 306 to a multiplexer 29; the multiplexer 29 for selecting either one of the judgment signal 306 and the control signal 107; the subtracter 24 for subtracting the square of the set amplitude value A or "0" as a multiplexer output from the square result; the delay 25 for executing the operation of (1+D); and the adder 26. The VGA controller 15c as error signal output means of the variable gain control unit squares the value extracted by the extracting unit, compares the square value with a predetermined value, subtracts either one of the predetermined first and second values corresponding to the comparison result from the square value, adds the subtracted square value and a subtracted square value just before it, and outputs an error signal to instruct the amplification gain of the variable gain amplifier.

In FIG. 6, the (1+D) block output 103 as an input signal 103 is squared by the multiplier 22. The discriminator 28 judges the multiplier output level and supplies the judgment signal 306 to the multiplexer. As an output value 303 of the multiplexer, in the region of the SYNC 42 in which the data is synchronized with the sampling clock, the square of the set amplitude value A is selected by the control signal 107. On the other hand, in the case where random data is input from the ID section 43 or DATA section 46, the following value is selected by the control signal 107.

$$V302 \geq (A/2)2 \ldots V303 = A2$$
$$0 < V302 < (A/2)2 \ldots V303 = 0$$

where, V302: input of discriminator
V303: output of multiplexer
A: set amplitude value of AGC In the above construction, although the operating characteristics of the circuit slightly differ from those shown in FIG. 5, the amplitude control operation can be executed in the whole region which needs the AGC control. The switching timing by the control signal 107 in the circuit mentioned above will be further practically explained with reference to Fig. 7.

Figure 7:
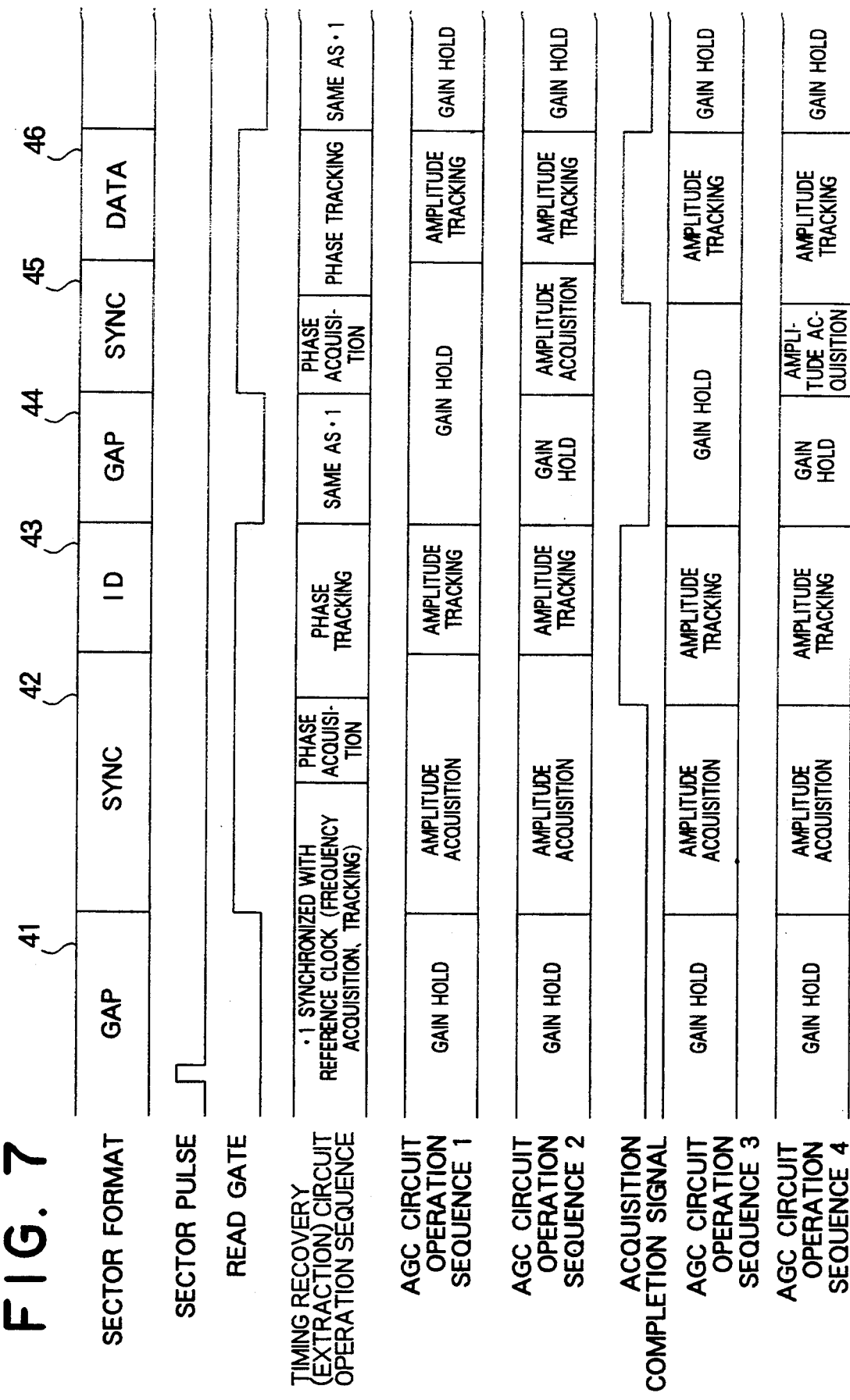
FIG. 7 is a diagram showing an operation sequence of the AGC circuit of the invention.

FIG. 7 shows an operation sequence of the timing recovery circuit and AGC circuit for a sector format on the magnetic recording medium. When the controller 7 receives a sector pulse that is generated at the head of each sector in the reading mode, read gates are enabled in the SYNC 42 and ID 43 next to the GAP 41. In response to it, the timing recovery circuit 5 completes the timing-phase acquisition in the SYNC 42 and executes the tracking operation in the ID 43 so that the phase is not deviated from the in-phase state. When the address information of the ID which was read out as mentioned above coincides with the address of the sector to be read out, the controller 7 once disables the read gates in the GAP 44 and again executes the timing-phase acquisition and the tracking operation in an SYNC 45 and a DATA 46. When the address doesn't coincide, the operations such that the read gates are disabled and the information of DATA of the relevant sector is not read but the information of the next sector is read out are repeated. In the AGC circuit 4, the VGA controller which is used by the control signal 107 is switched on the basis of a phase state between the input data and the clock due to the timing recovery circuit.

In the operation sequence 1 in FIG. 7, the VGA controller 15a is selected by the SYNC and the amplitude acquisition is executed. The timing recovery circuit starts the operation after the elapse of a predetermined time after the AGC circuit had started the amplitude acquisition. The AGC loop gain is set such as to complete the amplitude acquisition to a certain extent within a time until the timing recovery circuit starts the operation, thereby assuring the stable operation of the timing recovery circuit. Explaining further in detail, the AGC loop gain is set in a manner such that a gain fluctuation amount of the timing recovery circuit which occurs by an amplitude error which is not perfectly pulled in the set amplitude by the AGC circuit but remains at the start of the operation of the timing recovery circuit lies within an allowable value in consideration of the stability, acquisition time, and the like.

In the ID section in which the phase of the input data coincides with the phase of the clock, the VGA controller 15 is selected, thereby tracking the amplitude value so as not to be deviated from the set value. Subsequently, in the GAP 44, since the over-writing of data of the SYNC 45 is started at an arbitrary timing every writing operation, a phase state of the data near the boundary with the SYNC 45 cannot be specified. Therefore, the AGC circuit holds the gain of the VGA to a predetermined value without executing the feedback control. When considering a point that the ID and DATA exist on the same track and there is not so a large difference between the amplitude values of the data written in both of them, the gain which was pulled in the ID section can be used as a VGA gain when the data in the DATA section 46 is read out. In the sequence 1, therefore, such a gain holding operation is continued until the beginning of the DATA section 46, namely, for a period of time of the GAP 44 and SYNC 45. In the DATA, the tacking operation of the amplitude is again executed by the VGA controller 15.

An operation sequence 2 can cope with the case such that since the gain is held until the DATA is started in the above operation sequence 1, the amplitude values of the data in the ID section and DATA section actually differ and the amplitude value of the initial data of the DATA section differs from the set value or the like. The operation sequence 2 until the GAP 44 is similar to the sequence 1. However, although the gain is held even in the SYNC 45 in the sequence 1, the VGA controller 15a is again selected in the SYNC 45 and the feedback control is started in the sequence 2. Therefore, even in the case where the amplitudes of the ID section and DATA section are different as mentioned above, the acquisition is again executed in the period of the SYNC 45, so that the amplitude of the data in the DATA section can be set to the set value.

In operation sequences 3 and 4, the amplitude tracking operations by the VGA controller 15 in the sequences 1 and 2 are switched by using an acquisition completion signal. As an acquisition completion signal, it is possible to provide means for actually judging whether the phase acquisition has been completed from the state of the timing recovery circuit 5 or not and for producing such a signal. Or, as another means, since the time which is used by the timing recovery circuit for the phase acquisition is determined by the loop gain of the recovery circuit, it is reversely calculated from the loop gain and such a signal can be also produced. Since the loop gain is ordinarily set so as to sufficiently complete the phase acquisition before the end of SYNC and to switch to the phase tracking mode at a timing near the end of SYNC, the timings to start the amplitude tracking operation in the sequences 3 and 4 are earlier than those in the sequences 1 and 2. Operation switching control signals in those sequences can be produced by the controller 7 in a manner similar to the reading gates which are used in the timing recovery circuit or can be produced in the outside of the controller by using the sector pulse in a manner similar to the method of producing in the controller.

According to the AGC circuit in the embodiment, not only in a state in which the data is synchronized with the sampling clock but also in a state in which they are asynchronous, the amplitude value can be controlled to the set value. The reliability of the operation of the timing recovery circuit at the post stage can be raised.

What is claimed is:

1. An AGC (Automatic Gain Control) circuit comprising:
   a VGA (Variable Gain Amplifier) which changes an amplification gain of an input signal in accordance with an instruction; and
   a variable gain control unit for instructing an amplification gain of said variable gain amplifier in a manner such that an amplitude of an input signal is set to a predetermined amplitude on the basis of a value extracted at a predetermined interval from a value of an output of said variable gain amplifier,
   wherein said variable gain control unit has error signal output means for squaring said extracted value and generating an error signal to instruct the amplification gain of said variable gain amplifier in a manner such that the amplitude of the input signal is set to the predetermined amplitude on the basis of said square value and a square value just before it and integrating means for integrating the error signal from said error signal output means and instructing the amplification gain of said variable gain amplifier.

2. An AGC circuit according to claim 1, wherein said error signal output means sets the result which is obtained by subtracting the value corresponding to the predetermined amplitude from the sum of the square value of said extracted value and the square value just before into the error signal.

3. An AGC circuit according to claim 1, wherein in addition to said error signal output means (hereinafter, referred to as first error signal output means), said variable gain control unit further has:
   second error signal output means which differs from said first error signal output means and generates an error signal from said extracted value in a manner such that the amplitude of said input signal is equal to the predetermined amplitude; and
   switching control means for switching said first and second error signal output means at a predetermined timing.

4. An AGC circuit according to claim 3, wherein said switching control means controls so as to use the first error signal output means when data of said input signal is asynchronous with said predetermined extracting interval.

5. An AGC circuit according to claim 3, wherein said switching control means controls so as to use the first error signal output means in case of an asynchronous state upon inputting of a sync signal in the input signal and to use the second error signal output means upon inputting of a signal other than the sync signal in the input signal.

6. An AGC circuit comprising:
   a VGA (variable gain amplifier) which changes an amplification gain of an input signal in accordance with an instruction; and
   a variable gain control unit for instructing an amplification gain of said variable gain amplifier in a manner such that an amplitude of the input signal is equal to a predetermined value on the basis of a value extracted at a predetermined interval from a value of an output of said variable gain amplifier,
   wherein said variable gain control unit has error signal output means for squaring said extracted value, for comparing said square value with a predetermined value, for subtracting either one of predetermined first and second value corresponding to the result of said comparison from said square value, for adding said subtracted square value and a subtracted square value just before it, and for generating an error signal for instructing the amplification gain of said variable gain amplifier and integrating means for integrating the error signal from said error signal output means and for instructing the amplification gain of said variable gain amplifier.

7. A data recording and reproducing apparatus comprising;
   a reading circuit for reading out a signal recorded in recording means;
   an amplifying circuit for amplifying the signal read out by said reading circuit;
   an AGC circuit for controlling an amplitude of the signal amplified by said amplifying circuit;
   a timing recovery circuit for recovering a timing clock from the signal whose amplitude was controlled by said AGC circuit;
   a decoder for sampling the signal whose amplitude was controlled by the AGC circuit by the timing clock recovered by said timing recovery circuit and for decoding data;

a converting circuit for converting the data decoded by said decoder into the analog signal; and an output circuit for outputting the analog signal converted by said converting circuit, wherein said AGC circuit has a variable gain amplifier which changes an amplification gain of an input signal in accordance with an instruction and a variable gain control unit for instructing the amplification gain of said variable gain amplifier in a manner such that the amplitude of the input signal is equal to a predetermined amplitude on the basis of the value which was extracted at a predetermined interval from a value of an output of said variable gain amplifier, and said variable gain control unit has first error signal output means for squaring said extracted value and for generating a first error signal to instruct the amplification gain of said variable gain amplifier in a manner such that the amplitude of the input signal is equal to a predetermined amplitude from the amplitude of the input signal based on said square value and a square value just before it, second error signal output means which differs from said first error signal output means and generates a second error signal in a manner such that the amplitude of the input signal is equal to a predetermined amplitude from said extracted value, switching control means for switching said first and second error signal output means at a predetermined timing, and integrating means for integrating the error signal which is selected and for instructing the amplification gain of said variable gain amplifier.

8. A data recording and reproducing apparatus comprising:

a reading circuit for reading out a signal recorded in recording means;

an amplifying circuit for amplifying the signal read out by said reading circuit;

an AGC circuit for controlling an amplitude of the signal amplified by said amplifying circuit;

a timing recovery circuit for recovering a timing clock from the signal whose amplitude was controlled by said AGC circuit;

a decoder for sampling the signal whose amplitude was controlled by the AGC circuit by the timing clock recovered by said timing recovery circuit and for decoding data;

a converting circuit for converting the data decoded by said decoder into the analog signal; and an output circuit for outputting the analog signal converted by said converting circuit, wherein said AGC circuit has a variable gain amplifier which changes an amplification gain of an input signal in accordance with an instruction and a variable gain control unit for instructing the amplification gain of said variable gain amplifier in a manner such that the amplitude of the input signal is equal to a predetermined amplitude on the basis of the value which was extracted at a predetermined interval from a value of an output of said variable gain amplifier, and said variable gain control unit has an error signal output means for squaring said extracted value, for comparing said square value with a predetermined value, for subtracting either one of predetermined first and second values corresponding to the result of said comparison from said square value, for adding said subtracted square value and a square value just before it, and for generating an error signal to instruct the amplification gain of said variable gain amplifier and integrating means for integrating the error signal from said error signal output means and for instructing the amplification gain of said variable gain amplifier.

* * * * *